(12) United States Patent
Sakairi et al.

(10) Patent No.: US 8,868,388 B2
(45) Date of Patent: Oct. 21, 2014

(54) CONTACT DEFINING DEVICE, CONTACT DEFINING METHOD, AND NON-TRANSITORY COMPUTER READABLE STORAGE MEDIUM

(75) Inventors: Makoto Sakairi, Kawasaki (JP); Sachiko Furuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 313 days.

(21) Appl. No.: 13/064,461

(22) Filed: Mar. 25, 2011

(65) Prior Publication Data
US 2011/0313733 A1     Dec. 22, 2011

(30) Foreign Application Priority Data

Jun. 18, 2010  (JP) ................................. 2010-139877

(51) Int. Cl.
G06G 7/48     (2006.01)
G06F 17/50    (2006.01)

(52) U.S. Cl.
CPC .................................. G06F 17/5018 (2013.01)
USPC .............................................. 703/7; 345/420

(58) Field of Classification Search
USPC .............. 703/6, 7; 345/419, 420, 423; 707/6; 348/51; 463/32
See application file for complete search history.

(56) References Cited

U.S. PATENT DOCUMENTS

| | | | |
|---|---|---|---|
| 5,448,687 A * | 9/1995 | Hoogerhyde et al. | 345/423 |
| 5,988,862 A * | 11/1999 | Kacyra et al. | 703/6 |
| 6,999,073 B1 * | 2/2006 | Zwern et al. | 345/420 |
| 8,004,517 B1 * | 8/2011 | Edelsbrunner et al. | 345/419 |
| 8,447,572 B2 | 5/2013 | Ishikawa | |
| 2004/0155877 A1 * | 8/2004 | Hong et al. | 345/419 |
| 2006/0028465 A1 | 2/2006 | Imai | |
| 2009/0104990 A1 * | 4/2009 | Tsujino et al. | 463/32 |
| 2010/0017407 A1 * | 1/2010 | Beniyama et al. | 707/6 |
| 2010/0020076 A1 * | 1/2010 | Hashima | 345/420 |
| 2010/0020161 A1 * | 1/2010 | Bertrams et al. | 348/51 |

FOREIGN PATENT DOCUMENTS

| | | |
|---|---|---|
| JP | 06-266807 | 9/1994 |
| JP | 11-015857 | 1/1999 |
| JP | 2006-048583 | 2/2006 |
| JP | 2008-165488 | 7/2008 |
| JP | 2008-250641 | 10/2008 |
| JP | 2009-059028 | 3/2009 |

OTHER PUBLICATIONS

Satoshi, Japanese Patent Publication No. 2008250641 of Oct. 16, 2008—Abstract.*

(Continued)

*Primary Examiner* — Kandasamy Thangavelu
(74) *Attorney, Agent, or Firm* — Staas & Halsey LLP

(57) ABSTRACT

A contact defining device includes: a component moving unit that moves a component represented by data of a surface region in a 3D model in a predetermined direction; an overlap determination unit that determines whether or not the surface region of the component moved by the component moving unit includes an overlapping area that overlaps the surface region of another component; and a contact defining unit that, when a determination is made by the overlap determination unit that the surface region of the component includes the overlapping area that overlaps the surface region of another component, defines the overlapping area as a contact area with the another component.

10 Claims, 17 Drawing Sheets

(56) References Cited

OTHER PUBLICATIONS

Satoshi, Japanese Patent Publication No. 2008250641 of Oct. 16, 2008—Translation.*
Shigeo, Japanese Patent Publication No. 2008-165488 of Jul. 17, 2008—Abstract.*
Shigeo, Japanese Patent Publication No. 2008-165488 of Jul. 17, 2008—Translation.*
Japanese Office Action issued in copending Japanese Application No. 2010-139877 on Nov. 12, 2013.
Japanese Office Action mailed Mar. 11, 2014 in correspond Japanese Application No. 2010-139877.

* cited by examiner

CONTACT DEFINING DEVICE, CONTACT DEFINING METHOD, AND NON-TRANSITORY COMPUTER READABLE STORAGE MEDIUM

CROSS-REFERENCE TO RELATED APPLICATION

This application is based upon and claims the benefit of priority of the prior Japanese Patent Application No. 2010-139877, filed on Jun. 18, 2010, the entire contents of which are incorporated herein by reference.

FIELD

The embodiments discussed herein are directed to a contact defining device, a contact defining method, and a non-transitory computer readable storage medium.

BACKGROUND

In recent years, the structure of a design object such as an apparatus is often numerically analyzed by computer simulations in its design stage. The technology of numerically simulating physical phenomena using a computer is referred to as CAE (Computer Aided Engineering). In such a numerical analysis simulation, contact definitions may be applied in advance to the components of an apparatus to be analyzed. More specifically, the numerical analysis software that performs the numerical analysis simulation makes a contact determination as to whether or not contact occurs between components, on the basis of the contact definition therebetween each time the components are deformed.

When contact definitions are not applied to components, problems may occur after execution of the numerical analysis simulation. One problem that can occur when contact definitions are not applied will be described with reference to FIG. 19. FIG. 19 is a diagram illustrating the problem when contact definitions are not applied. As illustrated in FIG. 19, an external force is applied to a component in a state in which all components are undeformed to bring them in a deformed state. Then components to which a contact definition has been applied come in contact with each other. However, in components to which no contact definition has been applied, a phenomenon called penetration in which one component is embedded in another component can occur, resulting in a problem that it is difficult for the numerical analysis to be performed appropriately.

In one means for contact definitions that can prevent the occurrence of the above problem, a user selects, using a modeler that assists the production of a 3D geometrical model, the geometrical surfaces of components represented by the 3D model to apply contact definitions to these components. In another means for contact definitions, a modeler automatically detects the geometrical surfaces of components spaced apart by a user specified distance or less to apply contact definitions to these components.

In one technique used when the geometrical surfaces of components are divided into a mesh, the contact regions of two components are defined as follows. The distances between each divided region of one component and divided regions of the other component that have normal vectors substantially opposite to the normal vector of the each divided region are determined, and the divided regions of these components that are closest to each other are used as the contact regions.

Patent Document 1: Japanese Laid-open Patent Publication No. 2009-059028
Patent Document 2: Japanese Laid-open Patent Publication No. 06-266807
Patent Document 3: Japanese Laid-open Patent Publication No. 2006-048583

However, with the conventional techniques of contact definitions between components, the contact definitions are applied to the geometrical surfaces of the components. Therefore, in a numerical analysis simulation performed after the contact definitions are applied, unnecessary contact determinations may be made, and this results in a problem that the numerical analysis time increases.

The conventional contact definitions between components will be described with reference to FIGS. 20 and 21. FIG. 20 is a diagram illustrating specific examples of contact areas between components, and FIG. 21 is a diagram illustrating the conventional contact definitions. In components A, B, C and D illustrated in FIG. 20, when a load is applied to the component A in the direction toward the component B, a surface of the component A that is on the side toward the component C comes into contact with a surface of the component C that is on the side toward the component A, and a surface of the component A that is on the side toward the component D comes into contact with a surface of the component D that is on the side of the component A. More specifically, in the surface of the component A, a surface A-C and a surface A-D are surfaces E that have the possibility of coming into contact with other components, and the other region is a region F that has no possibility of coming into contact with other components.

However, as illustrated in FIG. 21, in the conventional contact definitions, to define contact between the components A and C, a contact definition d1 is applied to a surface m1 of the component A that is on the side toward the component C and a surface m2 of the component C that is on the side toward the component A. More specifically, on the surface of the component A that is on the side toward the component C, the contact definition is applied to a region including a region F that has no possibility of coming into contact with the component C. Therefore, in a numerical analysis simulation performed after the contact definition is applied, the numerical analysis software makes unnecessary contact determinations, and this results in an increase in the numerical analysis time. This also occurs for a contact definition d2 applied between the surface m1 of the component A that is on the side toward the component B and a surface m4 of the component B that is on the side toward the component A and for a contact definition d3 applied between a surface m3 of the component D that is on the side toward the component B and the surface m4 of the component B that is on the side toward the component D.

In contact definitions applied between components using a modeler, the user makes contact determinations, and therefore omission of contact definitions can occur. When contact definitions between some components are omitted, the omitted contact definitions is applied separately, and then a numerical analysis simulation is performed. This results in a problem that the numerical analysis time increases.

When contact definitions are applied using the normal vectors of surface regions of components, the geometrical surface of each component must be divided into a mesh of surface regions. Therefore, contact definitions cannot be applied directly to the geometrical surfaces of the components.

SUMMARY

According to an aspect of an embodiment of the invention, a contact defining device includes a component moving unit for moving a component represented by data of a surface region in a 3D model in a predetermined direction; an overlap determination unit for determining whether or not the surface region of the component moved by the component moving unit includes an overlapping area that overlaps a surface region of another component; and a contact defining unit for, when a determination is made by the overlap determination unit that the surface region of the component includes the overlapping area that overlaps the surface region of the another component, defining the overlapping area as a contact area with the another component.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. However, the present invention is not limited to the embodiments.

[a] First Embodiment

Figure 1:
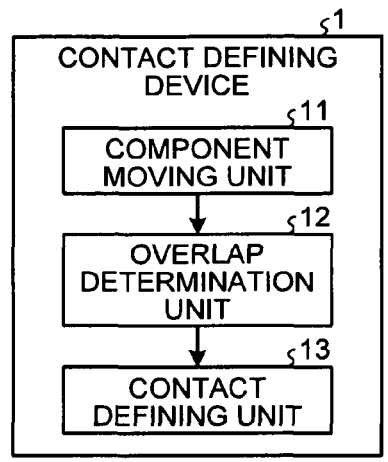
FIG. 1 is a functional block diagram illustrating the configuration of a contact defining device according to a first embodiment.

FIG. 1 is a functional block diagram illustrating the configuration of a contact defining device according to a first embodiment. As illustrated in FIG. 1, a contact defining device 1 includes a component moving unit 11, an overlap determination unit 12, and a contact defining unit 13.

The component moving unit 11 moves a component represented by data of its surface region in a 3D model in a predetermined direction. The data of the surface region of a component may be geometrical data in a 3D model or may be data of mesh division of a shape represented by geometrical data.

The overlap determination unit 12 determines whether or not the surface region of the component moved by the component moving unit 11 includes an area that overlaps the surface region of another component. When the overlap determination unit 12 makes a determination that the surface region of the moved component includes an area that overlaps the surface region of another component, the contact defining unit 13 defines the overlapping area as a contact area with the another component.

As described above, in the contact defining device 1, a component in the 3D model is moved in a predetermined direction. Then, when the surface region of the moved component includes an area that overlaps the surface region of another component, the overlapping area is defined as a contact area with the another component. Therefore, in the contact defining device 1, since the overlapping areas of components are used as contact areas, the contact areas of components can be better optimized than when the entire surface areas are used as overlapping areas. In the contact defining device 1, contact definitions can thereby be applied between components efficiently even when the components represented by a 3D model have geometrical shapes, and this allows a reduction in the time of numerical analysis to be performed.

[b] Second Embodiment

Configuration of Contact Defining Device According to the Second Embodiment

Figure 2:
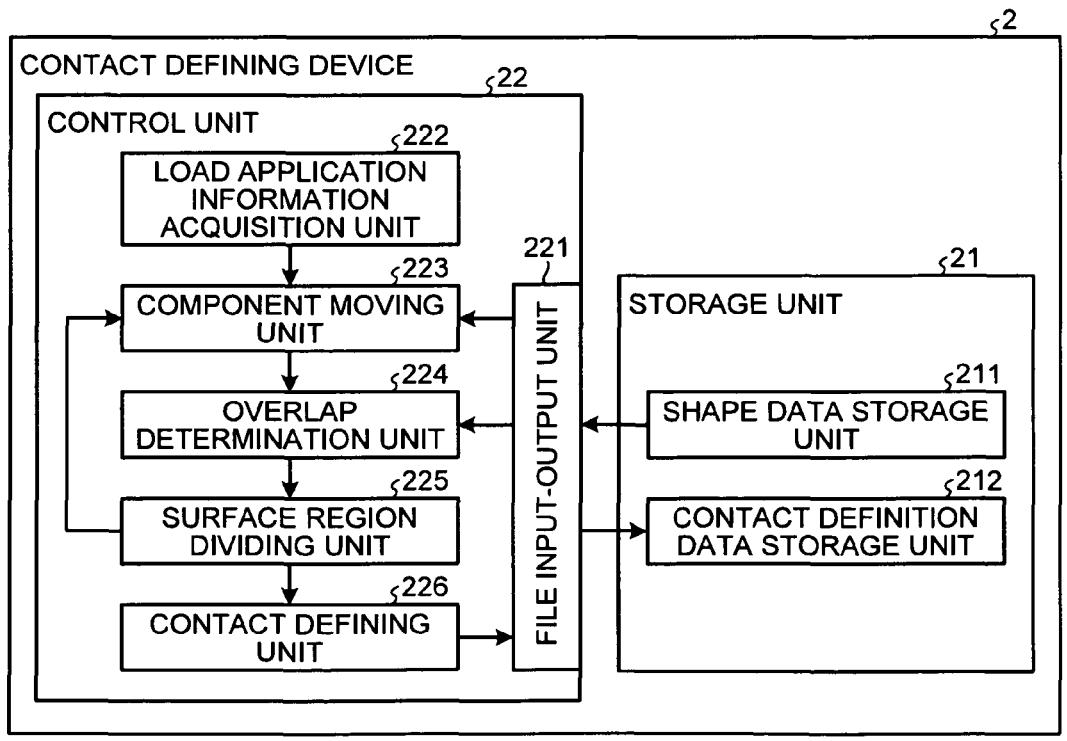
FIG. 2 is a functional block diagram illustrating the configuration of a contact defining device according to a second embodiment.

First, the configuration of a contact defining device 2 according to a second embodiment will be described with reference to FIG. 2. FIG. 2 is a functional block diagram illustrating the contact defining device according to the second embodiment. As illustrated in FIG. 2, the contact defining device 2 includes a storage unit 21 and a control unit 22. In the following embodiment, the contact defining device 2 is used for computer aided engineering (CAE), but the present embodiment is not a limitation.

The storage unit 21 has a shape data storage unit 211 and a contact definition data storage unit 212. The storage unit 21 includes, for example, a semiconductor memory device such as a RAM (Random Access Memory) or flash memory or a storage device such as a hard disk or an optical disk.

The shape data storage unit 211 stores shape data of the surface regions of components. More specifically, the shape data storage unit 211 stores the geometrical shape data (hereinafter abbreviated as shape data) of components in a 3D model. The 3D model may be, for example, a solid model, a surface model, or a wire frame model. The shape data includes the data of positions in a three-dimensional coordinate system.

The contact definition data storage unit 212 stores the data of contact definitions applied between the surface regions of components. More specifically, the contact definition data storage unit 212 stores shape data of pairs of overlapping surface regions of overlapping components. For example, the contact definition data storage unit 212 stores the shape data of the overlapping surface regions of each pair of components having overlapping surfaces in association with the component numbers and overlapping surface numbers of these components. Hereinafter, components having surfaces overlapping each other are referred to as "overlapping components."

The control unit 22 includes a file input-output unit 221, a load application information acquisition unit 222, a component moving unit 223, an overlap determination unit 224, a surface region dividing unit 225, and a contact defining unit 226. The control unit 22 is an integrated circuit such as an ASIC (Application Specific Integrated Circuit) or an FPGA (Field Programmable Gate Array) or an electronic circuit such as a CPU (Central Processing Unit) or an MPU (Micro Processing Unit).

The file input-output unit 221 controls input and output of the shape data stored in the shape data storage unit 211 and the contact definition data stored in the contact definition data storage unit 212. The load application information acquisition unit 222 acquires load application information necessary for contact definitions between components from, for example, the user or an external device (not illustrated). The load application information includes, for example, a component (deforming component) that is deformed first when a load is applied thereto, the load position in the deforming component to which the load is applied, the direction of the load, and the estimated amount of deformation of the deforming component (an estimated deformation amount). The load position in a component to which a load is applied is, for example, the center of gravity of the component.

The component moving unit 223 applies a load in a loading direction to a component represented by the data of the surface region in the 3D model and moves this component. More specifically, the component moving unit 223 uses, as a deforming component, a first component included in the load application information acquired by the load application information acquisition unit 222 and moves the deforming component from its load position in the loading direction by a predetermined amount at a time. The component moving unit 223 moves the deforming component repeatedly until the estimated deformation amount is achieved. After the deforming component is moved until the estimated deformation amount is achieved, the component moving unit 223 selects components in increasing order of the distance from the deforming component receiving the load and moves each selected component used as the next deforming component in the loading direction. The loading direction may be, for example, the installation direction of the components.

Each time after the movement by the component moving unit 223, the overlap determination unit 224 determines whether or not the surface region of a moved deforming component includes an area that overlaps the surface region of any other component. More specifically, the overlap determination unit 224 determines, on the basis of the shape data stored in the shape data storage unit 211, whether or not the surface region of the moved deforming component includes an area that overlaps a part or the entire area of the surface region of any other component. The overlap determination unit 224 also determines whether or not a surface region of a deforming component that has been divided from its overlapping area by the surface region dividing unit 225 described later includes an area that overlaps a part or the entire area of the surface region of any other component. For example, a minimax box in three-dimensional rectangular coordinates may be used for the determination method, but this is not a limitation.

When a determination is made by the overlap determination unit 224 that the surface region of a moved deforming component includes an area that overlaps the surface region of any other component, the surface region dividing unit 225 divides the surface region of each overlapping component into a surface region including the overlapping area and a surface region other than the overlapping area. The entire surface region of one of the overlapping components may coincide with the overlapping area, or the entire surface regions of both the overlapping components may coincide with the overlapping area. In these cases, the surface region dividing unit 225 does not perform the dividing processing on a component in which its entire surface region coincides with the overlapping area. Then the surface region dividing unit 225 stores the shape data of the surface region of the deforming component that has been divided from its overlapping area temporarily in the storage unit 21.

The surface region dividing unit 225 may divide the surface region of each of the components into an overlappable region defined by adding an area having the possibility of overlapping to the overlapping area and a surface region other than the overlappable region, in consideration of the positional displacement of the deforming component after deformation. To set the overlappable region, a surface area having an area of a predetermined percent (%) of the area of the overlapping area is defined as the area having the possibility of overlapping, and the defined area is added to the overlapping area. The predetermined percent may be 10 or 15, for example, and the information thereof is pre-stored in the storage unit 21. Then the surface region dividing unit 225 stores the shape data of the surface region (other than the overlappable region) of each component temporarily in the storage unit 21.

The contact defining unit 226 defines the overlapping area of each component as its contact area. More specifically, the contact defining unit 226 stores, in the contact definition data storage unit 212, the shape data of the overlapping area of a deforming component in association with the shape data of the overlapping area of a component that overlaps the deforming component. For example, the contact defining unit 226 stores, in the contact definition data storage unit 212, the shape data of the overlapping areas of the deforming component and the component that overlaps the deforming component in association with their component numbers and surface numbers of the surface regions including the overlapping areas.

Specific Example of Movements of Components

Figure 3:
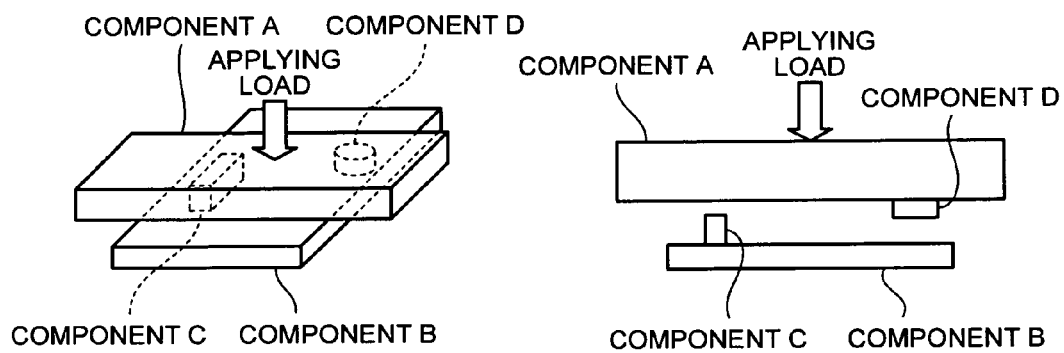
FIG. 3 is a diagram illustrating a specific example of movements of components.

A specific example of the movements of components by the component moving unit 223 will be described with reference to FIG. 3. FIG. 3 is a diagram illustrating the specific example of the movements of the components. In the description illustrated in FIG. 3, the shape data of components A, B, C, and D contained in a 3D model is used.

As illustrated in FIG. 3, the component moving unit 223 uses the component A as a first deforming component and applies a load thereto to move the component A from its load position in the loading direction by a predetermined amount at a time. The component moving unit 223 moves the component A repeatedly until an estimated deformation amount is achieved. After the deformation amount reaches the estimated deformation amount, the component moving unit 223 selects components in increasing order of the distance from the component A receiving the load and moves each selected component used as the next deforming component in the loading direction in a manner similar to that for the component A. In this example, the component moving unit 223 first moves the component A and then moves the component D, the component C, and the component B in that order.

Specific Examples of Surface Region Division

Figure 4:
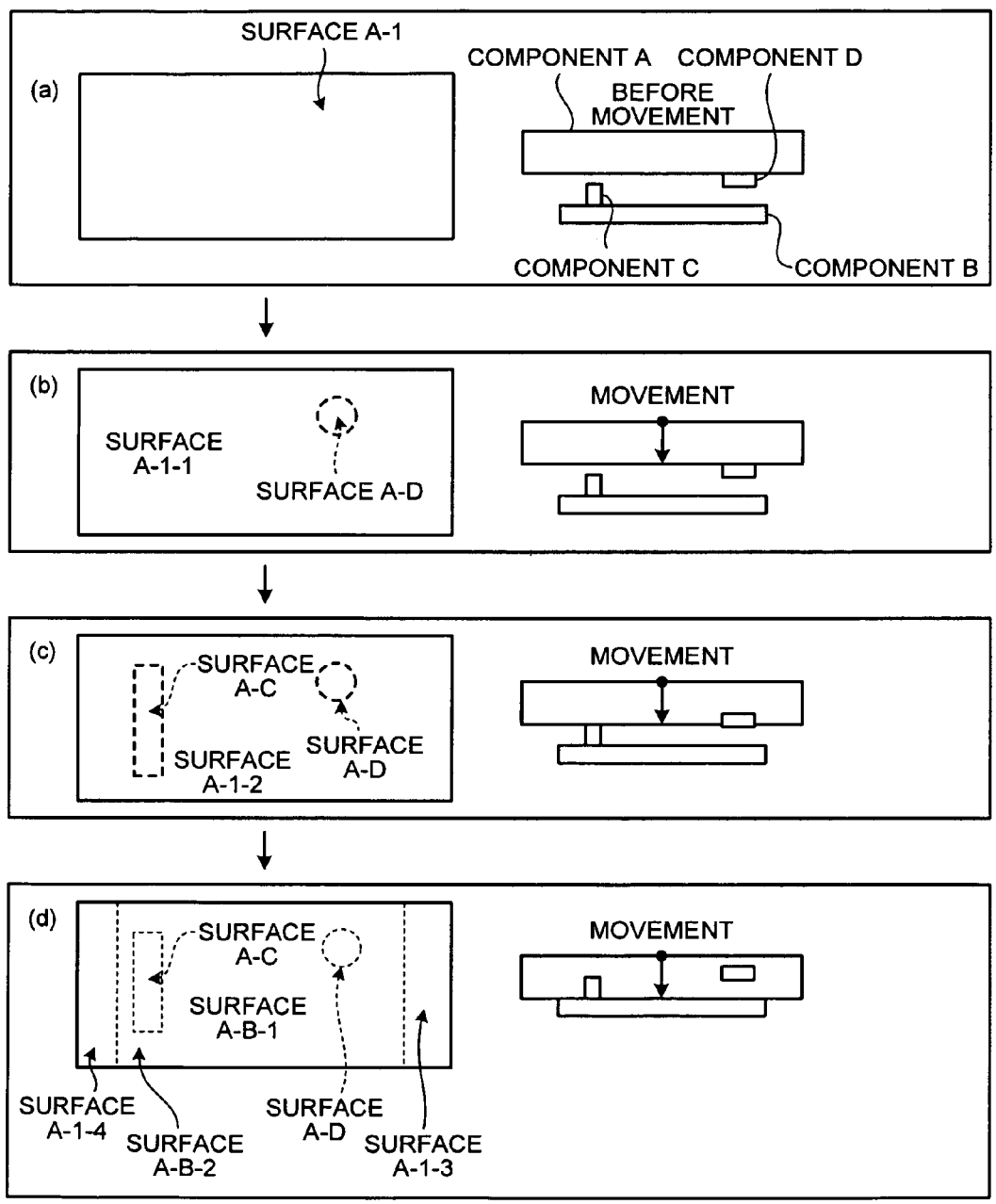
FIG. 4 is a diagram illustrating a specific example of surface region division during the movement of component A.
Figure 5:
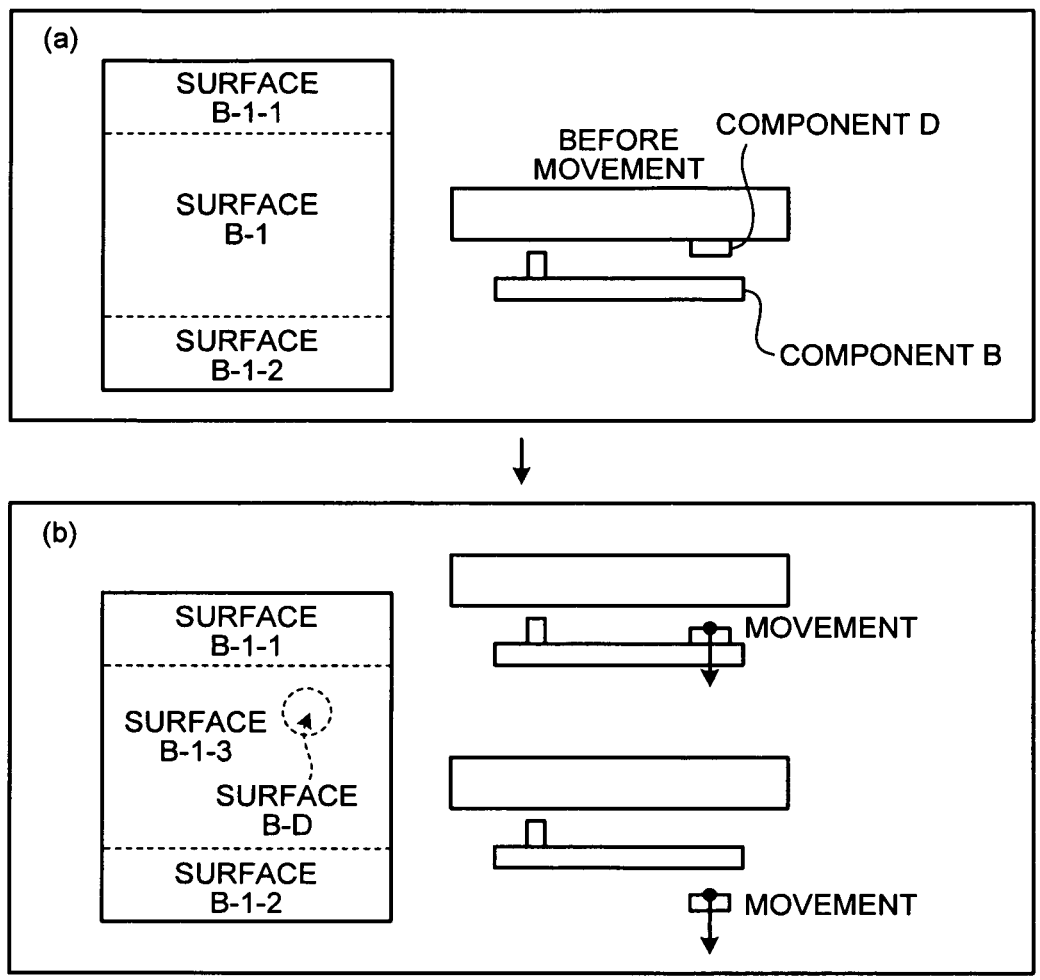
FIG. 5 is a diagram illustrating a specific example of surface region division during the movement of component D.
Figure 6:
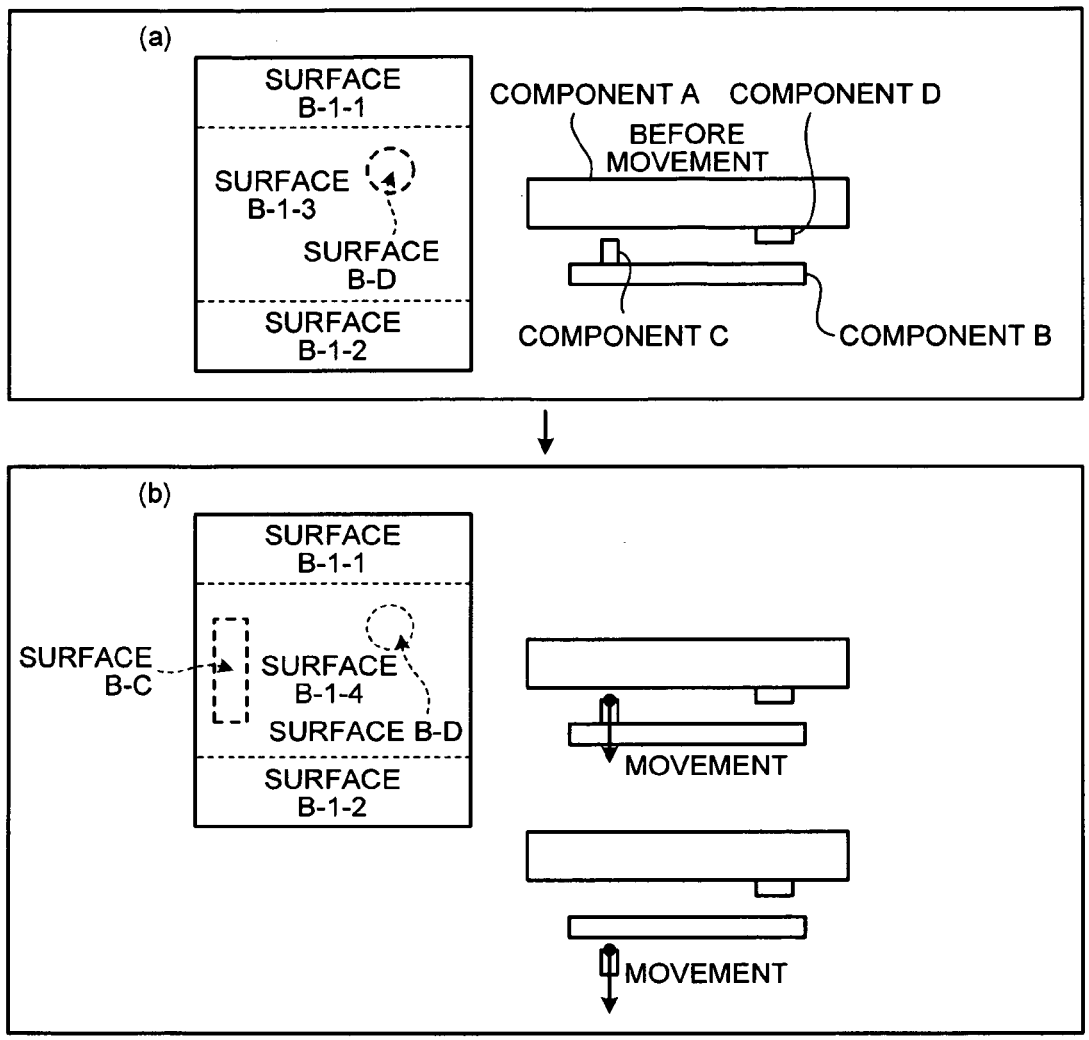
FIG. 6 is a diagram illustrating a specific example of surface region division during the movement of component C.

Specific examples of surface region division by the surface region dividing unit 225 will next be described with reference to FIGS. 4 to 6. FIG. 4 illustrates surface region division during the movement of the component A; FIG. 5 illustrates surface region division during the movement of the component D; and FIG. 6 illustrates surface region division during the movement of the component C. In the description in FIGS. 4 to 6, the shape data of the components A, B, C, and D in the 3D model is used.

First, a specific example of the surface region division during the movement of the component A will be described with reference to FIG. 4. FIG. 4 is a diagram illustrating the specific example of the surface region division during the movement of the component A. In the description in FIGS. 4(a) to 4(d), the component A is used as a deforming component, and diagrams illustrating the surface region division and deformation states of the component A during its movement are used.

As illustrated in FIGS. 4(a) to 4(d), the surface region of the component A is divided into surface regions including areas overlapping the surface regions of other components and a surface region other than the overlapping areas. As illustrated in FIG. 4(a), a surface A-1 of the component A that represents its surface region on the side toward the component B has not been divided before the component A is moved.

Next, as illustrated in FIG. 4(b), the component moving unit 223 moves the component A from its load position in a loading direction. After the component A is moved, the overlap determination unit 224 determines whether or not the surface A-1 of the moved component A includes an area that overlaps the surface region of any other component. As a result of the determination, the surface region dividing unit 225 recognizes that the surface A-1 of the component A includes an area that overlaps the surface region of the component D. Then the surface region dividing unit 225 divides the surface A-1 of the component A into a surface A-D that represents the area overlapping the component D and a surface A-1-1 other than the overlapping area.

Next, as illustrated in FIG. 4(c), the component moving unit 223 moves the component A further from its load position in the loading direction. After the component A is moved, the overlap determination unit 224 determines whether or not the surface A-1-1 of the moved component A includes an area that overlaps the surface region of any other component. As a result of the determination, the surface region dividing unit 225 recognizes that the surface A-1-1 of the component A includes an area that overlaps the surface region of the component C. Then the surface region dividing unit 225 divides the surface A-1-1 of the component A into a surface A-C that represents the area overlapping the component C and a surface A-1-2 other than the overlapping area.

Next, as illustrated in FIG. 4(d), the component moving unit 223 moves the component A further from its load position in the loading direction. After the component A is moved, the overlap determination unit 224 determines whether or not the surface A-1-2 of the moved component A includes an area that overlaps the surface region of any other component. As a result of the determination, the surface region dividing unit 225 recognizes that the surface A-1-2 of the component A includes an area that overlaps the surface region of the component B. Then the surface region dividing unit 225 divides the surface A-1-2 of the component A into surfaces A-B-1 and A-B-2 that represent the area overlapping the component B and surfaces A-1-3 and A-1-4 other than the overlapping area. After the component moving unit 223 moves the component A by an estimated deformation amount, the movement of the component A is stopped, and the component A is returned to its original position.

A specific example of the surface region division during the movement of the component D will next be described with reference to FIG. 5. FIG. 5 is a diagram illustrating the specific example of the surface region division during the movement of the component D. In the description in FIGS. 5(a) and 5(b), the component D is used as a deforming component, and diagrams illustrating the surface region division and deformation states of the component B during the movement of the component D are used.

As illustrated in FIGS. 5(a) and 5(b), a surface region of the component B is divided into a surface region including the area overlapping the surface region of the deforming component D and a surface region other than the overlapping area. As illustrated in FIG. 5(a), before the component D is moved, the surface region of the component B has been divided into a surface B-1 representing the area that can overlap the component A when the component A is used as a deforming component and moved and surfaces B-1-1 and B-1-2 other than the area that can overlap the component A. More specifically, the surface B-1 of the component B can overlap the surfaces A-B-1 and A-B-2 of the component A illustrated in FIG. 4(d).

Next, as illustrated in FIG. 5(b), the component moving unit 223 moves the component D from its load position in the loading direction. After the component D is moved, the overlap determination unit 224 determines whether or not the surface region of the moved component D includes an area that overlaps the surface region of any other component. As a result of the determination, the surface region dividing unit 225 recognizes that the surface region of the component D includes an area that overlaps the surface region of the component B. Since the area of the component D that overlaps the component B is the entire surface region of the component D, the surface region dividing unit 225 does not perform processing for dividing the surface region of the component D. However, the surface region dividing unit 225 divides the surface B-1 of the component B into a surface B-D that represents the area overlapping the component D and a surface B-1-3 other than the overlapping area. After the component moving unit 223 moves the component D by an estimated deformation amount, the movement of the component D is stopped, and the component D is returned to its original position.

A specific example of the surface region division during the movement of the component C will next be described with reference to FIG. 6. FIG. 6 is a diagram illustrating the specific example of the surface region division during the movement of the component C. In the description in FIGS. 6(a) and 6(b), the component C is used as a deforming component, and diagrams illustrating the surface region division and deformation states of the component B during the movement of the component C are used.

As illustrated in FIGS. 6(a) and 6(b), a surface region of the component B is divided into a surface region including the area overlapping the surface region of the deforming component C and a surface region other than the overlapping area. As illustrated in FIG. 6(a), before the component C is moved, the surface of the component B has been divided into the surfaces B-1-1, B-1-2, B-1-3, and B-D (see FIG. 5(b)) in relation to the components A and D moved as deforming components.

Next, as illustrated in FIG. 6(b), the component moving unit 223 moves the component C from its load position in the loading direction. After the component C is moved, the overlap determination unit 224 determines whether or not the surface region of the moved component C includes an area that overlaps the surface region of any other component. As a result of the determination, the surface region dividing unit 225 recognizes that the surface region of the component C includes an area that overlaps the surface region of the component B. Since the area of the component C that overlaps the component B is the entire surface region of the component C, the surface region dividing unit 225 does not perform processing for dividing the surface region of the component C. However, the surface region dividing unit 225 divides the surface B-1-3 of the component B into a surface B-C that represents the area overlapping the component C and a surface B-1-4 other than the overlapping area. After the component moving unit 223 moves the component C by an estimated deformation amount, the movement of the component C is stopped, and the component C is returned to its original position.

Modification of Surface Region Division

Figure 7:
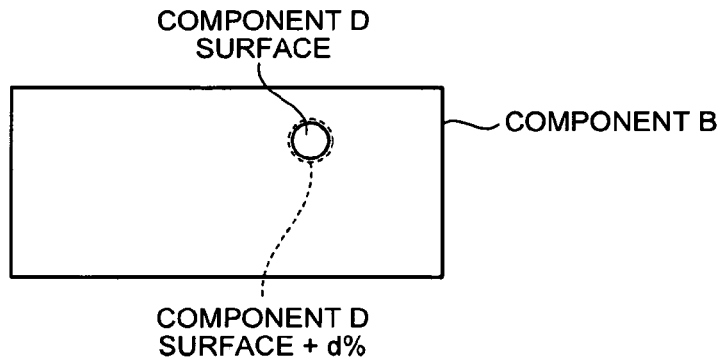
FIG. 7 is a diagram illustrating a modification of the surface region division.

A modification of the surface region division by the surface region dividing unit 225 will next be described with reference to FIG. 7. FIG. 7 is a diagram illustrating the modification of the surface region division. In the description in FIG. 7, a part of the surface region of the component B overlaps the entire surface region of the component D.

As illustrated in FIG. 7, the surface region dividing unit 225 divides the surface region of the component B into an overlappable region defined by adding, to the area overlapping the component D, an area having the possibility of overlapping and a surface region other than the overlappable region. In FIG. 7, the overlappable region is a region defined by adding, to "a component D surface" that represents the overlapping area between the components B and D, a surface area having an area of a predetermined percent d of the area of "the component D surface." "d" may be 10 or 15, for example, and the information thereof is pre-stored in the storage unit 21. In this manner, the contact definition can be applied in consideration of the positional displacement of the deforming component D after deformation.

Overall Procedure of Numerical Analysis Processing

Figure 8:
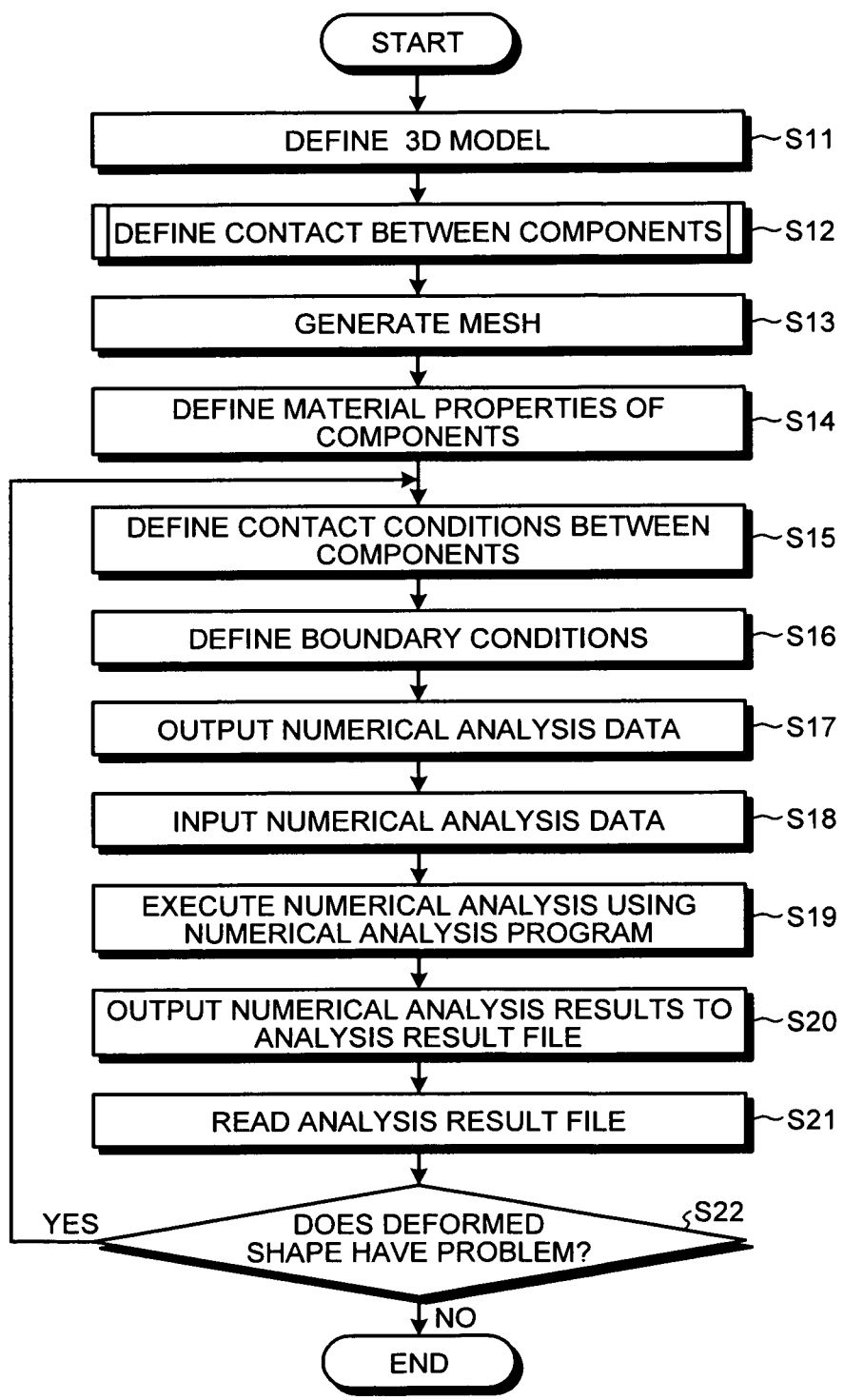
FIG. 8 is a flowchart illustrating the overall procedure of numerical analysis processing.

The overall procedure of the numerical analysis processing using the contact defining device 2 will next be described with reference to FIG. 8. FIG. 8 is a flowchart illustrating the overall procedure of the numerical analysis. In this exemplary procedure, the boundary element method is used as the analysis method. However, a similar procedure can be used for any other analysis method such as the finite element method.

First, the user defines a 3D model (components) used for the analysis (step S11). The 3D model is a three-dimensional geometrical model. Then the contact defining device 2 according to the second embodiment applies contact definitions between the components defined in the 3D model (step S12). More specifically, an overlap between the surfaces of components facing each other is detected, and a contact definition is applied to these overlapping components. The processing of the contact definition will be described later in detail.

Next, a mesh for the analysis is automatically generated on the surface of each of the components defined in the 3D model (step S13). Then the user defines the material properties of the components defined in the 3D model (step S14). Next, contact conditions between the components with the mesh generated thereon are defined (step S15). Then boundary conditions are defined for the components with the mesh generated thereon according to the type and purpose of the numerical analysis (step S16).

Next, numerical analysis data including the defined geometrical shapes, contact conditions, boundary conditions, and meshes of the components is outputted to a numerical analysis device that executes a numerical analysis program (step S17). The outputted numerical analysis data is inputted to the numerical analysis device (step S18), and the numerical analysis program executes the numerical analysis using the numerical analysis data (step S19).

Next, the numerical analysis device outputs the results of the numerical analysis to an analysis result file (step S20). Then the numerical analysis device reads the analysis result file (step S21) and displays the deformed components on the basis of the analysis result file. Then the user determines whether or not the deformed shape of each component has a problem (step S22). When a determination is made that the deformed shape of a component has a problem (step S22: Yes), the process moves to step S15 to redefine the contact conditions between the components. When a determination is made that the deformed shape of each component has no problem (step S22: No), the numerical analysis processing is ended.

Procedure of Contact Defining Processing

Figure 9:
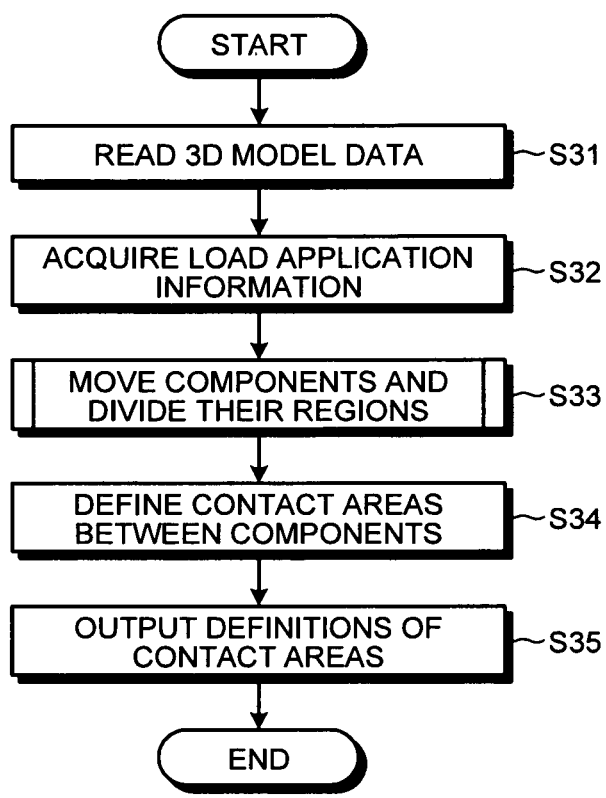
FIG. 9 is a flowchart illustrating the procedure of contact defining processing.

The processing procedure of the contact defining processing described in step S12 in FIG. 8 will next be described with reference to FIG. 9. FIG. 9 is a flowchart illustrating the procedure of the contact defining processing.

First, the control unit 22 reads, from the shape data storage unit 211, the 3D model shape data of the components to which contact definitions are applied (step S31). Then the load application information acquisition unit 222 acquires, from the user or an external device, load application information necessary for the contact definitions applied between the components (step S32).

Next, while the component moving unit 223 moves each component according to the load application information, the surface region dividing unit 225 divides the surface region of each component into a surface region including an area that overlaps any other component and a surface region other than the overlapping area (step S33). The processing of surface region division will be described later in detail.

Next, the contact defining unit 226 defines the surface regions of components that include the overlapping areas as contact areas (step S34). Then the contact defining unit 226 outputs the pairs of the defined contact areas of the components to the contact definition data storage unit 212 (step S35).

Procedure of Surface Region Division Processing

Figure 10:
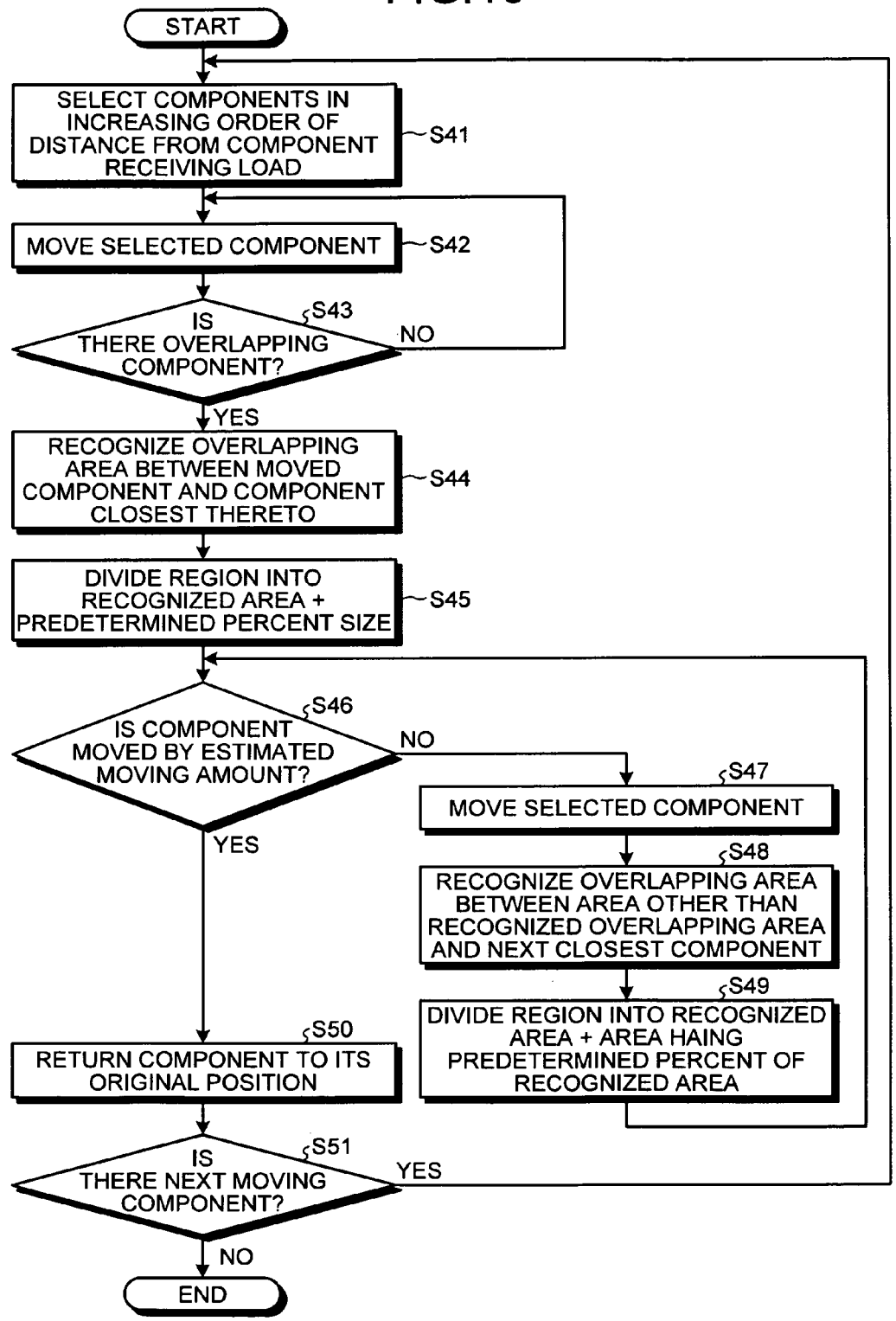
FIG. 10 is a flowchart illustrating the procedure of surface region division processing.

The processing procedure of the surface region division processing described in step S33 in FIG. 9 will next be described with reference to FIG. 10. FIG. 10 is a flowchart illustrating the procedure of the surface region division processing.

First, the component moving unit 223 selects components in increasing order of the distance from a component to which a load is applied (step S41). More specifically, the component moving unit 223 first selects, as a deforming component, the component to which the load is applied (the information of this component is included in the load application information).

Next, the component moving unit 223 moves the selected component (deforming component) from its load position in a loading direction by a predetermined amount at a time (step S42). Then the overlap determination unit 224 determines whether or not the surface region of the moved deforming component includes an area that overlaps the surface region of any other component (step S43). When a determination is made by the overlap determination unit 224 that there is no overlapping area (step S43: No), the process moves to step S42 to move the deforming component further. When a determination is made by the overlap determination unit 224 that there is an overlapping area (step S43: Yes), the surface region dividing unit 225 recognizes the overlapping area between the surface region of the deforming component and the surface region of another component (step S44).

Then the surface region dividing unit 225 divides the surface region of each of the overlapping components into an overlappable region defined by adding a predetermined percent of the area of the recognized overlapping area to this overlapping area and a surface region other than the overlappable region (step S45). The predetermined percent may be 10 or 15, for example, and the information thereof is pre-stored in the storage unit 21. In the above description, the surface region dividing unit 225 divides the surface region of each overlapping component into an overlappable region and a surface region other than the overlappable region, but this is not a limitation. The surface region of each overlapping component may be divided into the overlapping area and a surface region other than the overlapping area.

Next, a determination is made as to whether or not the component moving unit 223 has moved the deforming component by an estimated moving amount (step S46). When a determination is made that the component moving unit 223 has not moved the deforming component by the estimated moving amount (step S46: No), the component moving unit 223 moves the deforming component further from its load position in the loading direction by the predetermined amount (step S47).

Next, When a determination is made by the overlap determination unit 224 that there is an overlapping area, the surface region dividing unit 225 recognizes the overlapping area between a surface region of the divided deforming component that is other than the previously recognized overlapping area thereof and the surface region of another component (step S48). Then the surface region dividing unit 225 divides the surface region of each of the overlapping components into an overlappable region defined by adding the predetermined percent of the area of the recognized overlapping area to this overlapping area and a surface region other than the overlappable region (step S49), and then the process moves to step S46.

When a determination is made that the component moving unit 223 has moved the deforming component by the estimated moving amount (step S46: Yes), the component moving unit 223 returns the deforming component to its original position (step S50). Next, the component moving unit 223 determines whether or not there is a component to be moved (step S51). More specifically, the component moving unit 223 determines whether or not there is an unmoved component next to the current deforming component in the direction away from the component to which the load is applied.

When a determination is made that there is a next component to be moved by the component moving unit 223 (step S51: Yes), the process moves to step S41. When a determination is made that there is no next component to be moved by the component moving unit 223 (step S51: No), the surface region division processing is ended.

Effects of Second Embodiment

According to the second embodiment described above, the component moving unit 223 moves a component (deforming component) represented by the data of its surface region in the 3D model in the loading direction. Then the overlap determination unit 224 determines whether or not the surface region of the deforming component moved by the component moving unit 223 includes an area that overlaps the surface region of any other component. When a determination is made by the overlap determination unit 224 that the surface region of the deforming component includes an area that overlaps the surface region of any other component, the surface region dividing unit 225 divides the surface region of the deforming component into a surface region including the overlapping area and a surface region other than the overlapping area. Then the contact defining unit 226 defines the surface region of each overlapping component that includes the overlapping area as a contact area.

In the above configuration, when the surface region of a deforming component includes an area that overlaps any other component, the surface region dividing unit 225 divides the surface region of the deforming component into the overlapping area and an area other than the overlapping area. Therefore, the surface region dividing unit 225 can make a next overlapping determination using the surface region divided from the overlapping area. This allows the contact defining unit 226 to define the overlapping areas that have been determined by the overlap determination as contact areas, so that the contact definitions can be applied efficiently.

Figure 11:
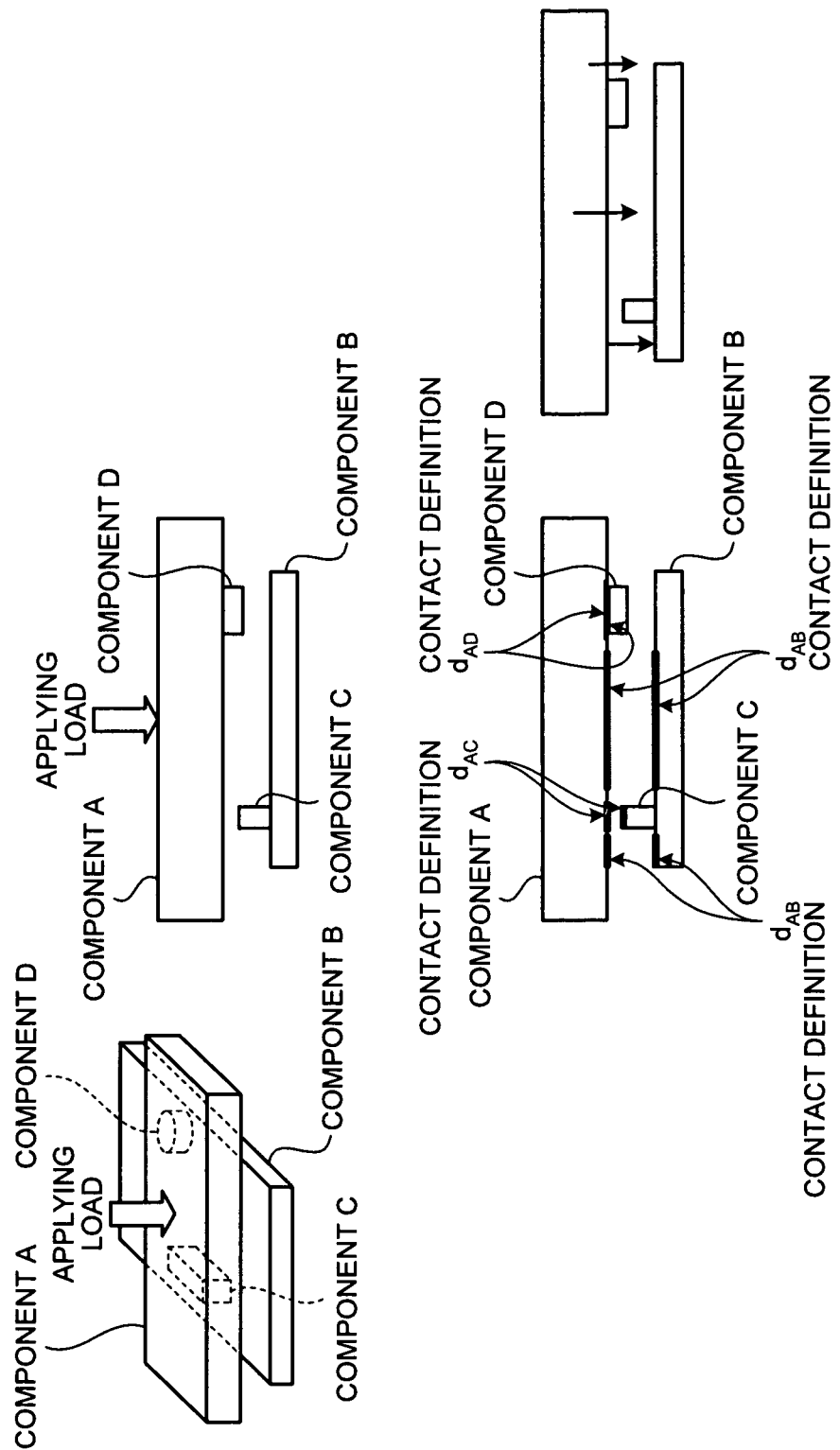
FIG. 11 is a diagram illustrating specific examples of contact definitions according to the second embodiment.

Specific examples of the contact definitions using the contact defining device 2 will next be described with reference to FIG. 11. FIG. 11 is a diagram illustrating the specific examples of the contact definitions according to the second embodiment. In the description of the examples in FIG. 11, the contact definitions are applied in relation to the component A when the component moving unit 223 applies a load to the component A.

As illustrated in FIG. 11, when the component moving unit 223 applies the load to the component A, the contact defining unit 226 applies a contact definition $d_{AD}$ between a surface of the component A that is on the side toward the component D and a surface of the component D that is on the side toward the component A. Similarly, when the load is applied to the component A, the contact defining unit 226 applies a contact definition $d_{AC}$ between a surface of the component A that is on the side toward the component C and a surface of the component C that is on the side toward the component A. Similarly, when the load is applied to the component A, the contact defining unit 226 applies a contact definition $d_{AB}$ between a surface of the component A that is on the side toward the component B and a surface of the component B that is on the side toward the component A. As described above, the contact defining unit 226 defines the overlapping areas of the overlapping components as contact areas. Therefore, the contact definitions can be applied more efficiently than when the entire surfaces including the overlapping areas are used as the contact areas.

According to the second embodiment described above, the surface region dividing unit 225 divides the surface region of a component into an overlappable region defined by adding an area having the possibility of overlapping to the overlapping area and a surface region other than the overlappable region. In this configuration, since the surface region dividing unit 225 divides the surface region of a component into an overlappable region and a surface region other than the overlappable region, the contact defining unit 226 can define the contact area of the component using the overlappable region. Therefore, in the numerical analysis performed after the contact definitions are applied between the components, even when the positional deformation of a component occurs for some reason after deformation, a contact determination can be made correctly because a contact definition has been applied to a region including a region shifted due to the positional deformation (i.e., to an overlappable region). This allows a reduction in the numerical analysis time.

According to the second embodiment described above, the overlap determination unit 224 determines whether or not a surface region of a moved component that has been divided from its overlapping area by the surface region dividing unit 225 includes an area that overlaps the surface region of any other component. In this configuration, the overlap determination unit 224 determines whether or not the surface region of a moved component that has been divided from its previously recognized overlapping area includes an area that overlaps any other component. Therefore, an area overlapping another component can be found in an efficient manner. This allows the contact defining unit 226 to define the determined overlapping areas of overlapping components as contact areas, and the contact definitions can be applied efficiently.

[c] Third Embodiment

In the description of the contact defining device 2 according to the second embodiment, contact definitions are applied between components in the 3D model having geometrical shape data. However, the contact defining device 2 is not limited thereto. Contact definitions may be applied between components in a 3D model having data of mesh division of shapes represented by geometrical shape data.

In a third embodiment, a description will be given of a case in which the contact defining device 2 applies contact definitions between components in a 3D model having data of mesh division of shapes represented by geometrical shape data.

Configuration of Contact Defining Device According to the Third Embodiment

Figure 12:
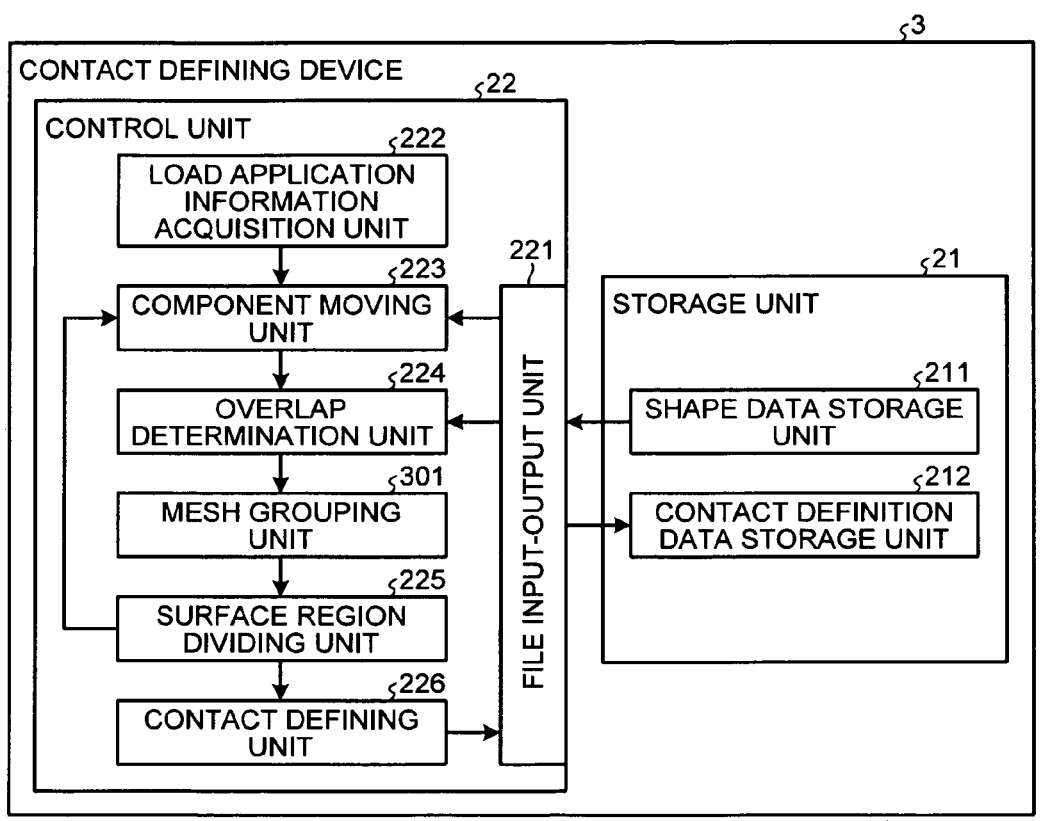
FIG. 12 is a functional block diagram illustrating the configuration of a contact defining device according to a third embodiment.

FIG. 12 is a functional block diagram illustrating the configuration of a contact defining device according to the third embodiment. The same components as those of the contact defining device illustrated in FIG. 2 are denoted by the same reference numerals, and a redundant description of such components and their operations is omitted. The difference between second and third embodiments is that a mesh grouping unit 301 is contained in a contact defining device 3.

The shape data storage unit 211 stores data of the surface region of each component. More specifically, the shape data storage unit 211 stores the data of mesh division of the shapes represented by the geometrical shape data of the components in the 3D model (hereinafter abbreviated as shape data). The shape data storage unit 211 may also store the geometrical shape data. The shape data includes the data of positions in a three-dimensional coordinate system.

Each time after the movement by the component moving unit 223, the overlap determination unit 224 determines whether or not the surface region of a moved deforming component includes an area that overlaps the surface region of any other component. More specifically, the overlap determination unit 224 determines, on the basis of the shape data stored in the shape data storage unit 211, whether or not the mesh surface region of the moved deforming component includes an area that overlaps a part or the entire area of the surface region of any other component. The overlap determination unit 224 also determines whether or not a mesh surface region of a deforming component that has been divided from its overlapping area by the surface region dividing unit 225 described later includes an area that overlaps a part or the entire area of the surface region of any other component. For example, a minimax box in three-dimensional rectangular coordinates may be used for the determination method, but this is not a limitation.

When a determination is made by the overlap determination unit 224 that the mesh surface region of a moved deforming component includes an area that overlaps the surface region of any other component, the mesh grouping unit 301 groups a plurality of surface mesh elements of each overlapping component that extend over the recognized overlapping area.

The surface region dividing unit 225 divides the mesh surface region of each component having an overlapping area into a mesh surface region including the surface mesh elements grouped by the mesh grouping unit 301 and a mesh surface region other than this mesh surface region. The entire mesh surface region of one of overlapping components may coincide with the overlapping area, or the entire mesh surface regions of both the overlapping components may coincide with the overlapping area. In these cases, the surface region dividing unit 225 does not perform the dividing processing on a component in which its entire mesh surface region coincides with the overlapping area. Then the surface region dividing unit 225 stores the shape data of a mesh surface region of the deforming component that has been divided from its mesh surface region including the grouped mesh surface elements temporarily in the storage unit 21.

Specific Example of Movements of Components

Figure 13:
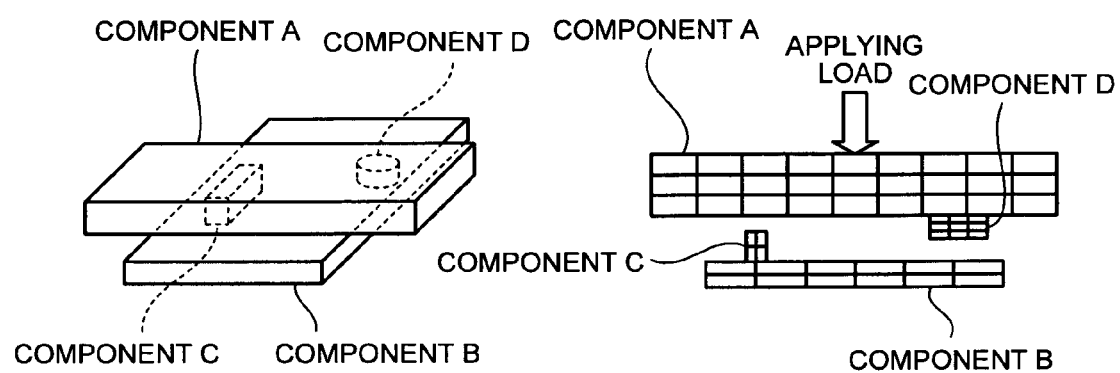
FIG. 13 is a diagram illustrating a specific example of movements of components.

A specific example of the movements of the components by the component moving unit 223 will next be described with reference to FIG. 13. FIG. 13 is a diagram illustrating the specific example of the movements of the components. In the description in FIG. 13, the shape data of the components A, B, C, and D in the 3D model having the shape data of mesh division of the surfaces of the components is used.

As illustrated in FIG. 13, the component moving unit 223 uses the component A as a first deforming component and applies a load thereto to move the component A from its load position in a loading direction by a predetermined amount at a time. The component moving unit 223 moves the component A repeatedly until an estimated deformation amount is achieved. After the deformation amount reaches the estimated deformation amount, the component moving unit 223 selects components in increasing order of the distance from the component A receiving the load and moves each selected component used as the next deforming component in the loading direction in a manner similar to that for the component A. In this example, after the component A is moved, the component D, the component C, and the component B are moved in that order.

Specific Example of Mesh Grouping

Figure 14:
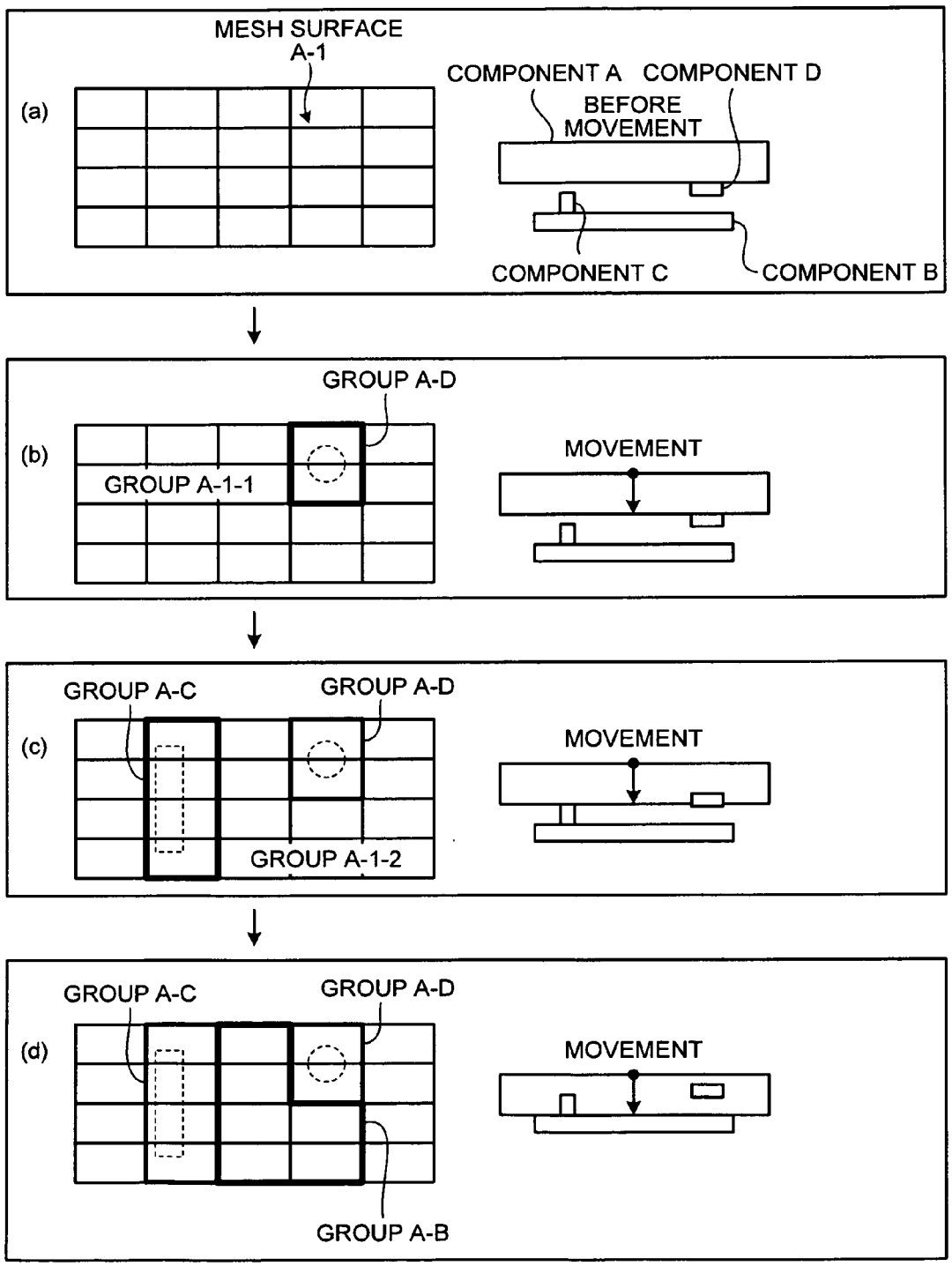
FIG. 14 is a diagram illustrating a specific example of mesh grouping during the movement of component A.

A specific example of mesh grouping by the mesh grouping unit 301 will next be described with reference to FIG. 14. FIG. 14 illustrates mesh grouping during the movement of the component A. In the description in FIG. 14, the shape data of the components A, B, C, and D in the 3D model having the shape data of mesh division of the surfaces of the components is used. In the description in FIGS. 14(*a*) to 14(*d*), the component A is used as a deforming component, and diagrams illustrating the mesh grouping and deformation states of the component A during its movement are used.

As illustrated in FIGS. 14(*a*) to 14(*d*), a plurality of surface mesh elements in the mesh surface region of the component A are grouped such that each group includes surface mesh elements that overlap the surface region of another component. First, as illustrated in FIG. 14(*a*), before the component A is moved, grouping has not been performed on the mesh surface A-1 indicating the mesh surface region of the component A that is on the side toward the component B.

Next, as illustrated in FIG. 14(*b*), the component moving unit 223 moves the component A from its load position in the loading direction. After the component A is moved, the overlap determination unit 224 determines whether or not the mesh surface A-1 of the moved component A includes an area that overlaps the surface region of any other component. As a result of the determination, the mesh grouping unit 301 recognizes that the mesh surface A-1 of the component A includes an area that overlaps the surface region of the component D and then groups a plurality of surface mesh elements extending over the overlapping area into a group A-D. Then the surface region dividing unit 225 divides the mesh surface A-1 of the component A into the group A-D and a group A-1-1 other than the group A-D.

Next, as illustrated in FIG. 14(*c*), the component moving unit 223 moves the component A further from its load position in the loading direction. After the component A is moved, the overlap determination unit 224 determines whether or not the grouped surface mesh elements (the group A-1-1) of the moved component A include an area that overlaps the surface region of any other component. As a result of the determination, the mesh grouping unit 301 recognizes that the grouped surface mesh elements (the group A-1-1) of the component A include an area that overlaps the surface region of the component C and then groups a plurality of surface mesh elements extending over the overlapping area into a group A-C. Then the surface region dividing unit 225 divides the grouped surface mesh elements (the group A-1-1) of the component A into the group A-C and a group A-1-2 other than the group A-C.

Next, as illustrated in FIG. 14(*d*), the component moving unit 223 moves the component A further from its load position in the loading direction. After the component A is moved, the overlap determination unit 224 determines whether or not the grouped surface mesh elements (the group A-1-2) of the moved component A include an area that overlaps the surface region of any other component. As a result of the determination, the mesh grouping unit 301 recognizes that the grouped surface mesh elements (the group A-1-2) of the component A include an area that overlaps the surface region of the component B and then groups a plurality of surface mesh elements extending over the overlapping area into a group A-B. Then the surface region dividing unit 225 divides the grouped surface mesh elements (the group A-1-2) of the component A into the group A-B and a group (not illustrated) other than the group A-B. After the component moving unit 223 moves the component A by the estimated deformation amount, the movement of the component A is stopped, and the component A is returned to its original position.

Therefore, the contact defining unit 226 applies a contact definition between the mesh surface group A-D of the component A and a mesh surface group D-1 (not illustrated) of the component D that is on the side toward the component A. The contact defining unit 226 also applies a contact definition between the mesh surface group A-C of the component A and a mesh surface group C-1 (not illustrated) of the component C that is on the side toward the component A. The contact defining unit 226 also applies a contact definition between the mesh surface group A-B of the component A and a mesh surface group B-1 (not illustrated) of the component B that is on the side toward the component A.

Procedure of Contact Definition Processing

Figure 15:
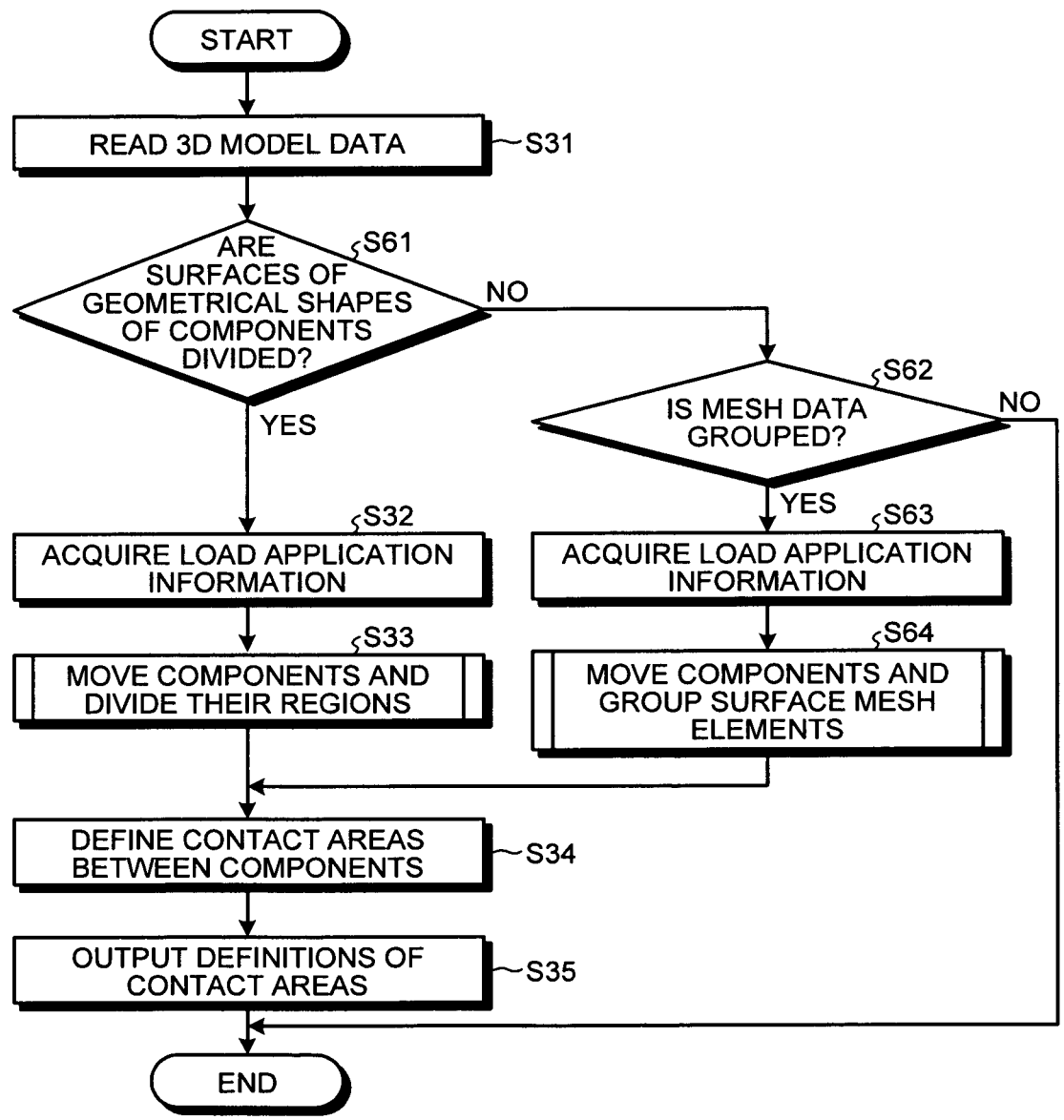
FIG. 15 is a flowchart illustrating the procedure of contact defining processing.

The processing procedure of the contact defining processing according to the third embodiment will next be described with reference to FIG. 15. FIG. 15 is a flowchart illustrating the procedure of the contact defining processing. In the contact defining processing according to the third embodiment, the same processing steps as those in the contact defining processing according to the second embodiment (FIG. 9) are denoted by the same numerals, and a redundant description of these steps is omitted.

First, the control unit 22 reads, from the shape data storage unit 211, the 3D model shape data of the components to which contact definitions are applied (step S31) and then determines whether or not division processing is performed on the surface regions of the components that are represented by geometrical data (step S61). For example, the control unit 22 receives a request for division processing of the geometrical data from the user or an external device and then makes a determination on the basis of the request.

When a determination is made by the control unit 22 that the division processing is not performed on the surface regions of the components that are represented by geometrical data (step S61: No), the control unit 22 determines whether or not mesh grouping is performed on the surface regions of the components that are represented by mesh data (step S62). For example, the control unit 22 receives a request for mesh grouping of the mesh data from the user or an external device and then makes a determination on the basis of the request.

When a determination is made by the control unit 22 that mesh grouping is not performed on the surface regions of the components that are represented by the mesh data (step S62: No), the contact definition processing is ended. However, When a determination is made by the control unit 22 that mesh grouping is performed on the surface regions of the components that are represented by mesh data (step S62: Yes), the load application information acquisition unit 222 acquires, from the user or an external device, the load application information necessary for the contact definitions applied between the components (step S63). Then the mesh grouping unit 301 performs mesh grouping processing on each component (step S64), and the process moves to step S34. The mesh grouping processing will be described later in detail.

When a determination is made by the control unit 22 that the division processing is performed on the surface regions of the components that are represented by geometrical data (step S61: Yes), the load application information acquisition unit 222 acquires, from the user or an external device, the load application information necessary for the contact definitions applied between the components (step S32). Next, while the component moving unit 223 moves each component according to the load application information, the surface region dividing unit 225 divides the surface region of each component into a surface region including an area that overlaps any other component and a surface region other than the overlapping area (step S33).

Next, the contact defining unit 226 defines the surface regions of components that include the overlapping areas as contact areas (step S34). Then the contact defining unit 226 outputs the pairs of the defined contact areas of the components to the contact definition data storage unit 212 (step S35).

Procedure of Mesh Grouping Processing

Figure 16:
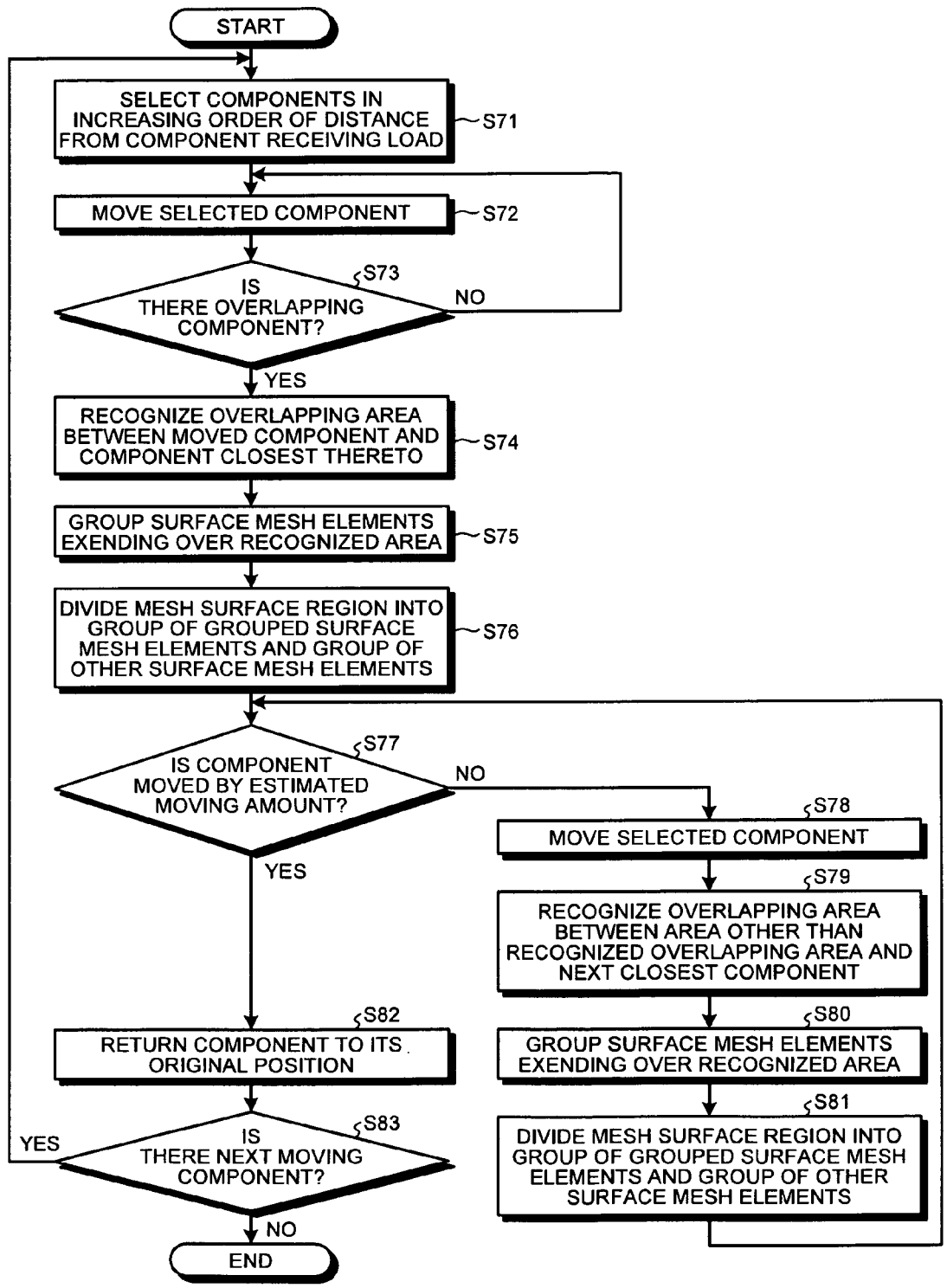
FIG. 16 is a flowchart illustrating the procedure of mesh grouping processing.

The processing procedure of the mesh grouping processing described in step S64 in FIG. 15 will next be described with reference to FIG. 16. FIG. 16 is a flowchart illustrating the procedure of the mesh grouping processing.

First, the component moving unit 223 selects components in increasing order of the distance from a component to which a load is applied (step S71). More specifically, the component moving unit 223 first selects, as a deforming component, the component to which the load is applied (the information of this component is included in the load application information).

Next, the component moving unit 223 moves the selected component (deforming component) from its load position in the loading direction by a predetermined amount at a time (step S72). Then the overlap determination unit 224 determines whether or not the surface region of the moved deforming component includes an area that overlaps the surface region of any other component (step S73). When a determination is made by the overlap determination unit 224 that there is no overlapping area (step S73: No), the process moves to step S72 to move the deforming component further.

When a determination is made by the overlap determination unit 224 that there is an overlapping area (step S73: Yes), the mesh grouping unit 301 recognizes the overlapping area between the surface region of the deforming component and the surface region of another, component (step S74). Then the mesh grouping unit 301 groups a plurality of surface mesh elements of each overlapping component that extend over the recognized overlapping area (step S75). Next, the surface region dividing unit 225 divides the mesh surface region of each component having an overlapping area into a mesh surface region including the surface mesh elements grouped by the mesh grouping unit 301 and a mesh surface region other than this mesh surface region (step S76).

Next, a determination is made as to whether or not the component moving unit 223 has moved the deforming component by an estimated moving amount (step S77). When a determination is made that the component moving unit 223 has not moved the deforming component by the estimated moving amount (step S77: No), the component moving unit 223 moves the deforming component further from its load position in the loading direction by the predetermined amount (step S78).

Next, when a determination is made by the overlap determination unit 224 that there is an overlapping area, the mesh grouping unit 301 recognizes the overlapping area between a mesh surface region of the divided deforming component that is other than the previously recognized overlapping area thereof and the surface region of another component (step S79). Then the mesh grouping unit 301 groups a plurality of surface mesh elements of each overlapping component that extend over the recognized overlapping area (step S80). Then the surface region dividing unit 225 divides the mesh surface region of each component having an overlapping area into a mesh surface region including the surface mesh elements grouped by the mesh grouping unit 301 and a mesh surface region other than this mesh surface region (step S81), and then the process moves to step S77.

When a determination is made that the component moving unit 223 has moved the deforming component by the estimated moving amount (step S77: Yes), the component moving unit 223 returns the moving component to its original position (step S82). Next, the component moving unit 223 determines whether or not there is a component to be moved (step S83). More specifically, the component moving unit 223 determines whether or not there is an unmoved component next to the current deforming component in the direction away from the component to which the load is applied.

When a determination is made that there is a next component to be moved by the component moving unit 223 (step S83: Yes), the process moves to step S71. When a determination is made that there is no next component to be moved by the component moving unit 223 (step S83: No), the mesh grouping processing is ended.

Effects of Third Embodiment

According to the third embodiment described above, when the data of the surface regions in the 3D model is data of mesh division of the surface regions, when the surface region of a component includes an area that overlaps the surface region of another component, the mesh grouping unit 301 groups a plurality of surface mesh elements extending over the overlapping area. Then the surface region dividing unit 225 divides the mesh surface region of each overlapping component into a mesh surface region including the surface mesh elements grouped by the mesh grouping unit 301 and a mesh surface region other than this mesh surface region.

In this configuration, when the data of the surface regions in the 3D model is the data of mesh division of these surface regions, the mesh grouping unit 301 groups surface mesh elements extending over the overlapping area in the surface region of each overlapping component. Then the surface region dividing unit 225 divides the mesh surface region of each overlapping component into a mesh surface region including the grouped surface mesh elements and a mesh surface region other than this mesh surface region. Therefore, the surface region dividing unit 225 can make a next overlapping determination using the surface mesh elements other than the grouped surface mesh elements. This allows the contact defining unit 226 to define surface mesh elements extending over the overlapping areas that have been determined by the overlap determination as contact areas, so that the contact definitions can be applied efficiently. In the numerical analysis performed after the contact definitions are applied between the components, even when the positional deformation of a component occurs for some reason after deformation, a contact determination can be made correctly because a contact definition has been applied to a region including a region shifted due to the positional deformation. This allows a reduction in the numerical analysis time.

According to the third embodiment described above, the overlap determination unit 224 determines whether or not a surface region of a moved component that has been divided from a plurality of surface mesh elements grouped by the mesh grouping unit 301 includes an area that overlaps the surface region of any other component. In this configuration, the overlap determination unit 224 determines whether or not the surface region of a moved component that has been divided from its grouped surface mesh elements extending over the previously recognized overlapping area includes an area that overlaps any other component. Therefore, an area overlapping another component can be found in an efficient manner. This allows the contact defining unit 226 to define surface mesh elements extending over the overlapping areas that have been determined by the overlap determination unit 224 as contact areas, so that the contact definitions can be applied efficiently.

Other Modifications

In the description of the second embodiment, the component to which the load is applied is moved in the loading direction. However, the component to which the load is applied may be moved in the loading direction and also in a direction orthogonal to the loading direction. Another specific example of the surface region division will be described with reference to FIG. 17 and FIG. 18. In this example, a component to which a load is applied is moved in a loading direction and also in a direction orthogonal to the loading direction. In the description in FIG. 17 and FIG. 18, the shape data of components A, B, and C included in a 3D model is used.

Figure 17:
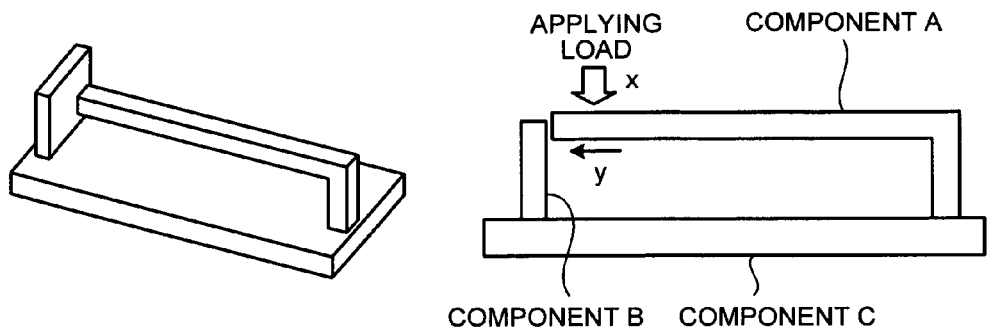
FIG. 17 is a diagram illustrating another specific example of surface region division.

FIG. 17 is a diagram illustrating the specific example of the surface region division. As illustrated in FIG. 17, the component moving unit 223 uses the component A as a deforming component and applies a load thereto to move the component A from its load position in a loading direction x by a predetermined amount at a time. When a determination is made by the overlap determination unit 224 that the surface region of the moved component A includes an area that overlaps the surface region of any other component, the surface region dividing unit 225 performs surface region division processing to divide the surface region of the component A into the overlapping area and an area other than the overlapping area. However, in this case, no other components overlap the surface region of the component A in the moving direction. Therefore, the surface region dividing unit 225 does not perform the surface region division processing in the moving direction x of the component A.

Next, the component moving unit 223 moves the component A used as the deforming component further from its load position in a direction y orthogonal to the loading direction x by a predetermined amount at a time while the load is applied in the loading direction x. Then when a determination is made by the overlap determination unit 224 that the surface region of the moved component A includes an area that overlaps the surface region of any other component, the surface region dividing unit 225 performs surface region division processing to divide the surface region of the component A into the overlapping area and an area other than the overlapping area. In this case, the component B overlaps the surface region of the component A in the moving direction. Therefore, the surface region dividing unit 225 performs surface region division processing in the moving direction y of the component A.

Figure 18:
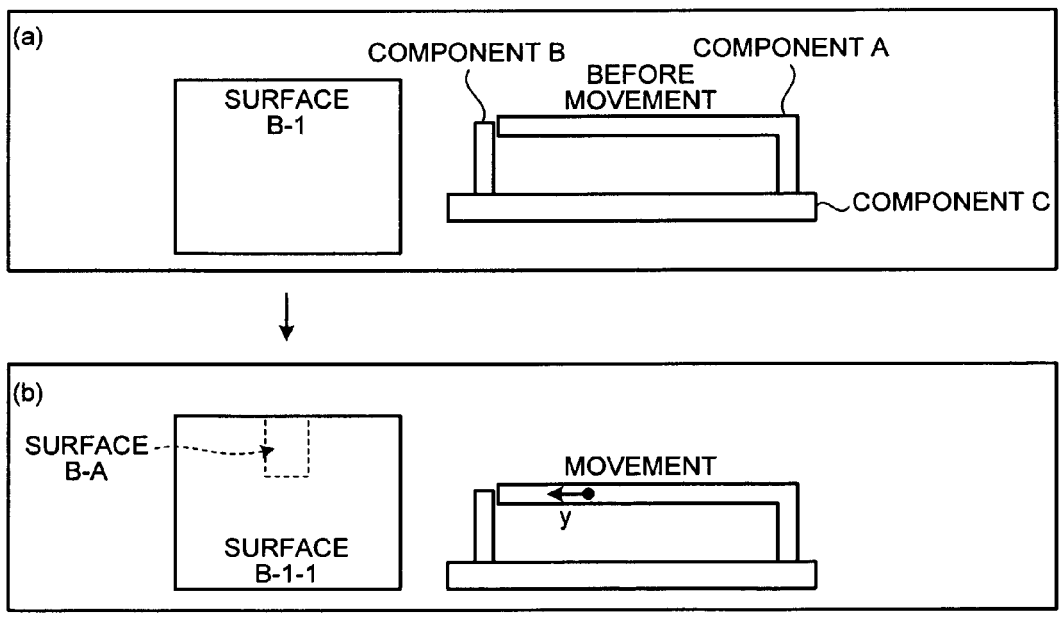
FIG. 18 is a diagram illustrating a specific example of surface region division during the movement of component A.
Figure 19:
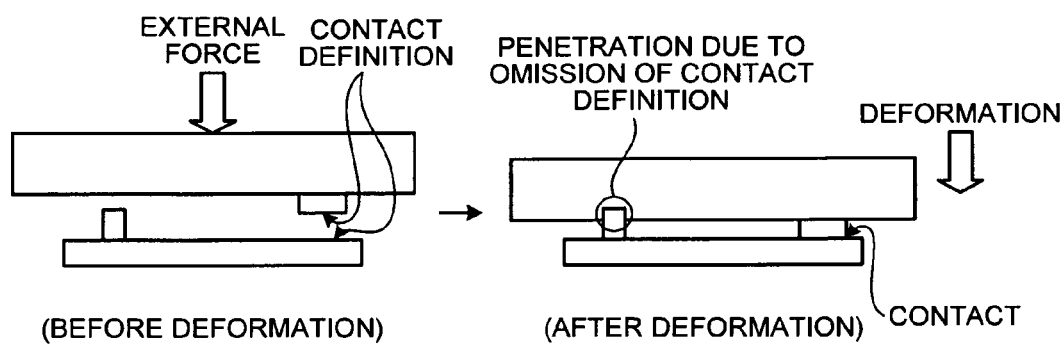
FIG. 19 is a diagram illustrating a problem that occurs when a contact definition is not applied.
Figure 20:
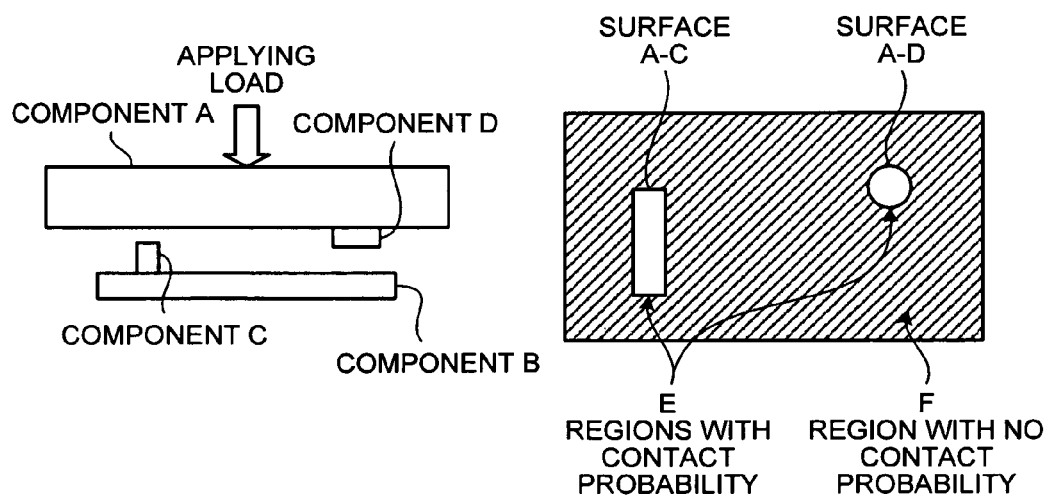
FIG. 20 is a diagram illustrating specific examples of contact regions.
Figure 21:
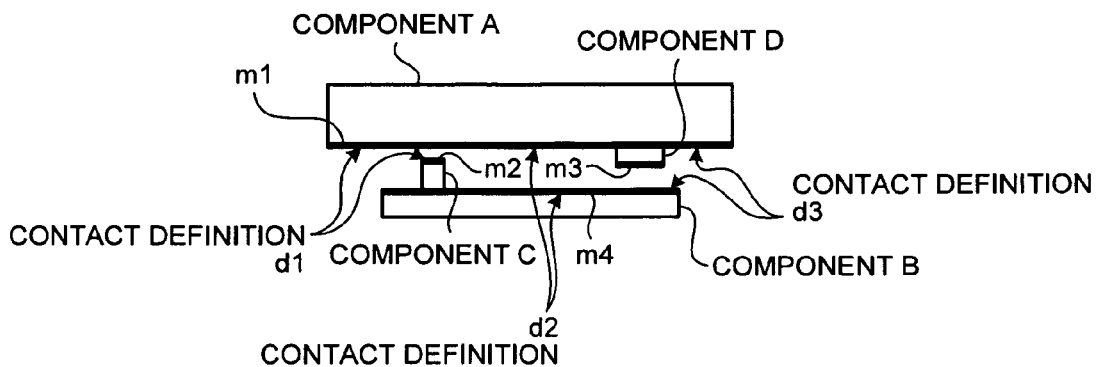
FIG. 21 is a diagram illustrating conventional contact definitions.

FIG. 18 is a diagrams illustrating the specific example of the surface region division during the movement of the component A. As illustrated in FIGS. 18(*a*) and 18(*b*), the surface region of the component B is divided into a surface region including the area overlapping the surface region of the deforming component A and a surface region other than the overlapping area. First, as illustrated in FIG. 18(*a*), a surface B-1 of the component B that indicates its surface region on the side toward the component A has not been divided before the component A is moved.

Next, as illustrated in FIG. 18(*b*), the component moving unit 223 moves the component A from its load position in the direction y orthogonal to the loading direction. After the component A is moved, the overlap determination unit 224 determines whether or not the surface region of the moved component A includes an area that overlaps the surface region of any other component. As a result of the determination, the surface region dividing unit 225 recognizes that the surface region of the component A includes an area that overlaps the surface region of the component B. In this case, since the entire surface region of the component A overlaps the component B, the surface region dividing unit 225 does not perform processing for dividing the surface region of the component A. However, the surface region dividing unit 225 divides the surface B-1 of the component B into a surface B-A that indicates the area overlapping the component A and a surface B-1-1 other than the overlapping area. It is appreciated that the surface region dividing unit 225 may divide the surface region of the component B into an overlappable region defined by adding an area having the possibility of overlapping to the overlapping area and a surface region other than the overlappable region, in consideration of the positional displacement of the component A after deformation.

The surface region division when a component to which a load is applied is moved in a loading direction and also in a direction orthogonal to the loading direction can be performed similarly even when the surface region of each component is divided into a mesh as in the third embodiment.

The constituent components of the devices illustrated in the figures are not necessarily configured physically in the manner illustrated in the figures. More specifically, the specific configuration of the distribution and integration of each device is not limited to those illustrated in the figures. A part of or all the constituent components may be freely distributed or integrated functionally or physically according to various loads, use conditions, and other factors. For example, the surface region dividing unit 225 and the contact defining unit 226 may be integrated into a single unit. Moreover, the shape data storage unit 211 may be divided into a geometrical data storage unit that stores the geometrical shape data of the components, a mesh data storage unit that stores the mesh data of the components, and a position data storage unit that stores the position data of the components. In each of the contact defining devices 2 and 3, the storage unit 21 may be an external device, and the above-described functions of each of the contact defining devices 2 and 3 may be achieved by cooperation with the storage unit 21 connected through a network. Particularly, a 3D model database unit including the shape data storage unit 211 that stores the shape data of the 3D model may be provided as an external device of the contact defining device 2 or 3, and the above-described functions of each of the contact defining devices 2 and 3 may be achieved by cooperation with the 3D model database unit connected through a network.

The various types of processing described in the above embodiments can be achieved by executing pre-installed programs on a computer such as a personal computer or a workstation. Therefore, an exemplary computer that executes a connection relation determination processing program having the same functions as those of the contact defining device 2 illustrated in FIG. 2 will next be described with reference to FIG. 22.

Figure 22:
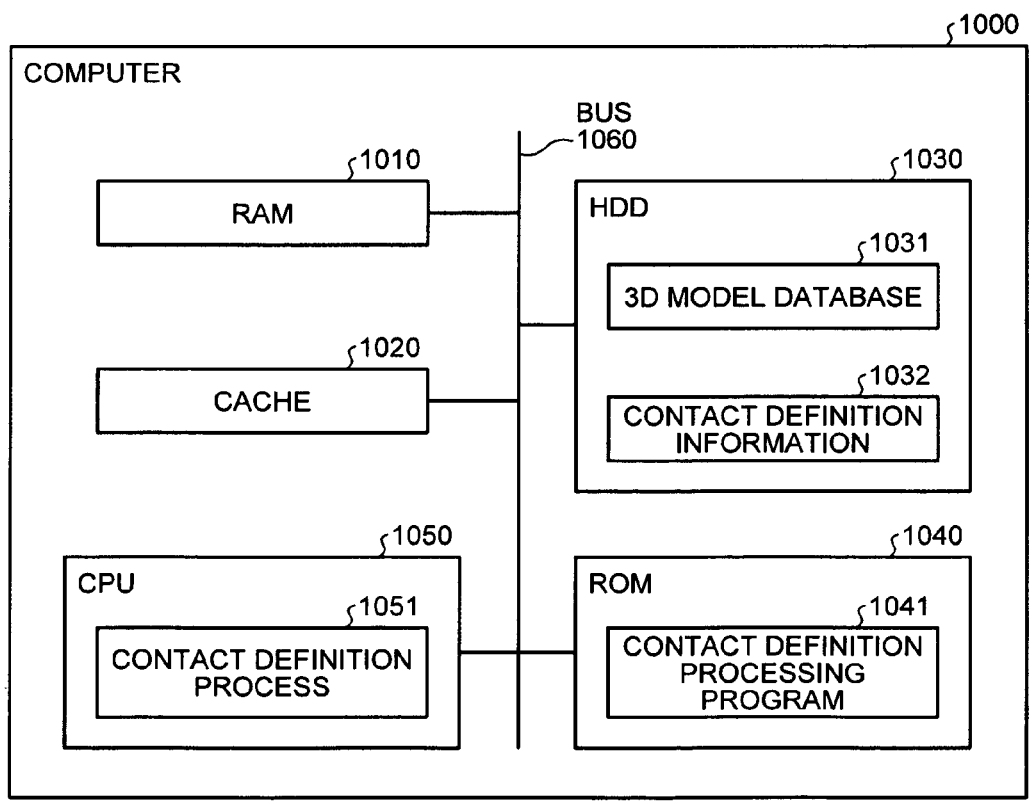
FIG. 22 is a diagram illustrating a computer that executes a contact defining processing program.

FIG. 22 is a diagram illustrating the computer that executes a contact defining processing program. As illustrated in FIG. 22, a computer 1000 includes a RAM (Random Access Memory) 1010, a cache 1020, a HDD 1030, a ROM (Read Only Memory) 1040, a CPU (Central Processing Unit) 1050, and a bus 1060. The RAM 1010, the cache 1020, the HDD 1030, the ROM 1040, and the CPU 1050 are connected through the bus 1060.

A contact defining processing program 1041 that has the same functions as those of the contact defining device 2 illustrated in FIG. 2 is pre-stored in the ROM 1040.

The CPU 1050 reads and executes the contact defining processing program 1041. The contact defining processing program 1041 is thereby used as a contact defining process 1051, as illustrated in FIG. 22. The contact defining process 1051 corresponds to the control unit 22 illustrated in FIG. 2.

A 3D model database 1031 and contact definition information 1032 are provided in the HDD 1030, as illustrated in FIG. 22. The 3D model database 1031 corresponds to, for example, the shape data storage unit 211 provided in the storage unit 21 illustrated in FIG. 2, and the contact definition information 1032 corresponds to the contact definition data storage unit 212 provided in the storage unit 21 illustrated in FIG. 2.

The contact defining processing program 1041 described above is not necessarily stored in the ROM 1040. For example, the contact defining processing program 1041 may be stored in a "portable physical medium" inserted into the computer 1000, such as a flexible disk (FD), a CD-ROM, an MO-disc, a DVD disc, a magneto-optical disc, or an IC card. The contact defining processing program 1041 may be stored in a "fixed physical medium," such as a hard disk drive, installed inside or outside the computer 1000. The contact defining processing program 1041 may be stored in "another computer (or server)" connected to the computer 1000 through a public network, the Internet, a LAN, or a WAN. The computer 1000 may read the program from, for example, a flexible disk to execute the program.

In one aspect of the contact defining device disclosed in the present application, even when components represented by a 3D model have geometrical shapes, contact definitions can be applied between the components efficiently, and this can advantageously reduce the numerical analysis time.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it may be understood that the various changes, substitutions, and alterations could be made hereto without departing from the spirit and scope of the invention.

What is claimed is:

1. A contact defining device including:
   a processor; and
   a memory, wherein the processor executes:
   moving a component represented by data of a surface region in a 3D model in an installation direction of the component by a predetermined amount;
   determining whether the surface region of the moved component includes an overlapping area that overlaps a surface region of another component; and
   defining a contact area where the moved component and the another component overlap with each other, when the determining indicates that the surface region of the component includes the overlapping area that overlaps the surface region of the another component.

2. The contact defining device according to claim 1 wherein the processor executes:
   dividing the surface region of the component into a surface region including the overlapping area and a surface region other than the overlapping area, when the determining indicates that the surface region of the component includes the overlapping area that overlaps the surface region of the another component.

3. The contact defining device according to claim 2, wherein the dividing includes dividing the surface region of the component into an overlappable region defined by adding an area having a possibility of overlapping to the overlapping area and a surface region other than the overlappable region.

4. The contact defining device according to claim 1, wherein the determining includes determining whether the surface region of the moved component whose surface region has been divided from the overlappable region at the dividing includes an area that overlaps a surface region of another component.

5. The contact defining device according to claim 1, wherein the processor executes:
   grouping a plurality of surface mesh elements extending over the overlapping area into a group, when the data of the surface region in the 3D model is data of surface mesh elements of the surface region; and
   dividing the surface region of the component into the plurality of surface mesh elements grouped at the grouping unit and a surface mesh elements other than the plurality of surface mesh elements.

6. The contact defining device according to claim 5, wherein the determining includes determining whether a surface region of a moved component that has been divided from a plurality of surface mesh elements grouped at the grouping includes an area that overlaps a surface region of another component.

7. A contact defining method of defining contact between components by a computer, the method comprising:
   moving a component represented by data of a surface region in a 3D model in an installation direction of the component by a predetermined amount using a processor;
   determining whether the surface region of the moved component includes an overlapping area that overlaps a surface region of another component; and
   defining a contact area where the moved component and the another component overlap with each other, when the determining indicates that the surface region of the component includes the overlapping area that overlaps the surface region of the another component.

8. A non-transitory computer readable storage medium having stored therein a contact defining program causing a computer to execute a process comprising:
   moving a component represented by data of a surface region in a 3D model in an installation direction of the component by a predetermined amount;

determining whether the surface region of the moved component includes an overlapping area that overlaps a surface region of another component; and defining a contact area where the moved component and the another component overlap with each other, when the determining indicates that the surface region of the component includes the overlapping area that overlaps the surface region of the another component.

9. A contact defining device including:

a processor; and a memory, wherein the processor executes:

moving a component represented by data of a surface region in a 3D model in a predetermined direction;

determining whether the surface region of the moved component includes an overlapping area that overlaps a surface region of another component; and defining a contact area where the moved component and the another component overlap with each other, when the determining indicates that the surface region of the component includes the overlapping area that overlaps the surface region of the another component.

10. A contact defining device including:

a processor; and a memory, wherein the processor executes:

moving a component represented by data of a surface region in a 3D model in a predetermined direction;

determining whether the surface region of the moved component includes an overlapping area that overlaps a surface region of another component;

defining a contact area where the moved component and the another component overlap with each other, when the determining indicates that the surface region of the component includes the overlapping area that overlaps the surface region of the another component; and dividing the surface region of the component into an overlappable region defined by adding an area having a possibility of overlapping to the overlapping area and a surface region other than the overlappable region, when the determining indicates that the surface region of the component includes the overlapping area that overlaps the surface region of the another component.

* * * * *

UNITED STATES PATENT AND TRADEMARK OFFICE
CERTIFICATE OF CORRECTION

PATENT NO.        : 8,868,388 B2
APPLICATION NO.   : 13/064461
DATED             : October 21, 2014
INVENTOR(S)       : Makoto Sakairi et al.

Page 1 of 1

It is certified that error appears in the above-identified patent and that said Letters Patent is hereby corrected as shown below:

In the Claims

Column 22, Line 6, In Claim 1, after "the" insert -- moved --.
Column 22, Line 11, In Claim 2, after "region of the" insert -- moved --.
Column 22, Line 14, In Claim 2, after "region of the" insert -- moved --.
Column 22, Lines 19-20, In Claim 3, after "region of the" insert -- moved --.
Column 22, Line 20, In Claim 3, after "overlapping" insert -- the surface region of the another component --.
Column 22, Line 22, In Claim 4, delete "claim 1," and insert -- claim 3, --, therefor.
Column 22, Line 24, In Claim 4, delete "surface" and insert -- overlappable --, therefor.
Column 22, Line 25, In Claim 4, delete "overlappable" and insert -- surface --, therefor.
Column 22, Line 26, In Claim 4, delete "overlaps a" and insert -- overlaps the --, therefor.
Column 22, Line 26, In Claim 4, after "region of" insert -- the --.
Column 22, Line 34, In Claim 5, after "region of the" insert -- moved --.
Column 22, Line 36, In Claim 5, after "grouping" delete "unit".
Column 22, Line 37, In Claim 5, delete "elements." and insert -- elements grouped. --, therefor.
Column 22, Line 39, In Claim 6, delete "whether a" and insert -- whether the --, therefor.
Column 22, Line 40, In Claim 6, delete "region of a" and insert -- region of the --, therefor.
Column 22, Lines 40-41, In Claim 6, delete "from a" and insert -- into the --, therefor.
Column 22, Line 42, In Claim 6, delete "overlaps a" and insert -- overlaps the --, therefor.
Column 22, Line 55, In Claim 7, after "region of the" insert -- moved --.
Column 23, Line 6, In Claim 8, after "region of the" insert -- moved --.
Column 23, Line 19, In Claim 9, after "region of the" insert -- moved --.
Column 24, Line 11, In Claim 10, after "region of the" insert -- moved --.
Column 24, Line 14, In Claim 10, after "region of the" insert -- moved --.
Column 24, Line 16, In Claim 10, after "overlapping" insert -- the surface region of the another component --.
Column 24, Line 18, In Claim 10, after "region of the" insert -- moved --.

Signed and Sealed this
Thirtieth Day of June, 2015

Michelle K. Lee
*Director of the United States Patent and Trademark Office*